US008166641B2

(12) United States Patent
Han et al.

(10) Patent No.: US 8,166,641 B2
(45) Date of Patent: May 1, 2012

(54) HOLDING TRAY FOR SUBSTRATE, SUBSTRATE ALIGNMENT SYSTEM USING THE SAME AND METHOD THEREOF

(75) Inventors: Sang-Jin Han, Kyunggi-do (KR); Kwan-Seop Song, Kyunggi-do (KR); Hee-Cheol Kang, Kyunggi-do (KR); Seok-Heon Jeong, Kyunggi-do (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 301 days.

(21) Appl. No.: 11/325,575

(22) Filed: Jan. 5, 2006

(65) Prior Publication Data
US 2006/0144738 A1    Jul. 6, 2006

(30) Foreign Application Priority Data
Jan. 5, 2005    (KR) .......................... 10-2005-0000956

(51) Int. Cl.
*H01L 21/68* (2006.01)
(52) U.S. Cl. .......... 29/760; 206/722; 206/724; 414/936; 414/941
(58) Field of Classification Search .................... 29/758, 29/760; 439/73; 414/941, 936; 206/712, 206/722, 724, 725
See application file for complete search history.

(56) References Cited

U.S. PATENT DOCUMENTS
4,881,639 A * 11/1989 Matsuoka et al. ............ 206/724
5,192,087 A *  3/1993 Kawashima et al. .......... 279/71
5,971,156 A * 10/1999 Slocum et al. ............... 206/724
(Continued)

FOREIGN PATENT DOCUMENTS
JP            04-099275         3/1992
(Continued)

OTHER PUBLICATIONS
Office action from the Japanese Patent Office issued in Applicant's corresponding Japanese Patent Application No. 2005-202322 dated Mar. 6, 2009.
Office action from the State Intellectual Property Office of P.R. China issued in Applicant's corresponding Chinese Application No. 200510117051.3 dated Jun. 12, 2009.
Office action from Japanese Patent Office issued in Applicant's corresponding Japanese Patent Application No. 2005-202322 dated Mar. 9, 2010, and Request for Entry of the Accompanying Office Action for Japanese Office action attached herewith.
(Continued)

*Primary Examiner* — Livius R Cazan
(74) *Attorney, Agent, or Firm* — Robert E. Bushnell, Esq.

(57) ABSTRACT

Disclosed are a holding tray, a substrate alignment system using the same and a method thereof. More specifically, the present invention relates to a holding tray for substrate capable of accomplishing high-precision alignment and conducting a stable deposition. A holding means is included in at least one side of the substrate to hold and support the substrate in a manner that the substrate is vertically held and supported on a flat surface of the holding tray during a vacuum process. The holding tray according to the present invention, the substrate alignment system using the same, and the method thereof include a substrate on which a deposition is made, a frame formed to receive the substrate, a tray formed to receive the frame, and at least one holding means formed to hold the substrate on the frame.
The holding tray for substrate according to the present invention, the substrate alignment system using the same, and the method thereof are useful to accomplish high-precision alignment and conduct a stable deposition process due to the stable vertical arrangement of the substrate during the deposition process.

30 Claims, 31 Drawing Sheets

U.S. PATENT DOCUMENTS

| | | | |
|---|---|---|---|
| 6,143,147 A * | 11/2000 | Jelinek | 204/298.15 |
| 6,258,228 B1 * | 7/2001 | Reiss | 204/298.15 |
| 6,786,739 B2 * | 9/2004 | Frutschy et al. | 439/73 |
| 2003/0224109 A1 | 12/2003 | Kang et al. | |

FOREIGN PATENT DOCUMENTS

| | | |
|---|---|---|
| JP | 04-110466 | 4/1992 |
| JP | 10-302257 | 11/1998 |
| JP | 11-100669 | 4/1999 |
| JP | 11100669 | 4/1999 |
| JP | 11-163104 | 6/1999 |
| JP | 2006169625 | 6/2006 |
| JP | 2006191038 | 7/2006 |

OTHER PUBLICATIONS

Japanese Office Action issued by JPO on Sep. 13, 2011 in connection with Japanese Patent Application No. 2005-202322, which also claims Korean Patent Application No. 10-2005-0000956 as its priority document, and Request for Entry of the Accompanying Office Action attached herewith.

Office action from the State Intellectual Property Office of P. R. China issued in Applicant's corresponding Chinese patent Application No. 2005101170513 dated Nov. 14, 2008.

* cited by examiner

HOLDING TRAY FOR SUBSTRATE, SUBSTRATE ALIGNMENT SYSTEM USING THE SAME AND METHOD THEREOF

CLAIM OF PRIORITY

This application makes reference to, incorporates the same herein, and claims all benefits accruing under 35 U.S.C. §119 from an application for HOLDING TRAY FOR SUBSTRATE, SUBSTRATE ALIGNMENT SYSTEM USING THE SAME AND METHOD THEREOF, earlier filed in the Korean Intellectual Property Office on the 5$^{th}$ of Jan. 2005 and there duly assigned Serial No. 10-2005-0000956.

BACKGROUND OF THE INVENTION

1. Field of the Invention

The present invention relates to a holding tray for substrate, a substrate alignment system using the same and a method thereof, and more specifically to a holding tray for substrate capable of accomplishing high-precision alignment and conducting a stable deposition process. A holding means is included in at least one side of the substrate to hold and support the substrate that is to be vertically arranged. Therefore, the substrate can be vertically held and supported on a flat surface of the holding tray for a vacuum deposition process.

2. Related Art

Generally, a deposition process of a thin film is divided into two groups: deposition under vacuum and deposition under atmospheric pressure.

In the aforementioned deposition process, the method of depositing the thin film under vacuum has been used in the fields of semiconductors and display devices, because it may be used to form a high-purity thin film without contamination by foreign substances, and to deposit a thin film with relatively compact density.

When a deposition of a thin film is carried out under vacuum condition, the thin film was deposited using a batch process due to limitation of the volume of the process chamber and the size of the substrate which may be placed in the process chamber, etc.

Such a means for holding and supporting the substrate and the method thereof will be described in detail with reference to the accompanying drawings.

SUMMARY OF THE INVENTION

Therefore, it is an object of the present invention to provide a holding tray for substrate capable of accomplishing high-precision alignment and conducting a stable deposition process, and a substrate alignment system using the same and a method thereof.

In order to accomplish the above object, the holding tray for substrate according to the present invention includes a substrate on which a deposition is made, a frame formed to receive the substrate, a tray formed to receive the frame; and at least one holding means for substrate formed to hold the substrate on the frame.

Also, the holding means for substrate includes a press member for pressing and closely holding the substrate to the frame with specific elasticity in at least one side of the substrate.

Here, the press member preferably includes a projection for insertion in its end so that it can be elastically held with the frame by means of the elastic means. The frame further comprises a first protruded groove and a second protruded groove, where the projection is inserted into the first protruded groove for holding the substrate to the frame, and the projection is inserted into the second protruded groove for releasing the substrate from the frame.

Also, the press member may form a coupling hole in which a coupling member is anchored, and may suspend an elastic member in the coupling member to be elastically connected with the frame.

Also, the holding means includes at least one side supporter for supporting a side of the substrate.

Also, the holding means includes at least one bottom supporter for anchoring and supporting the substrate in a lower part of the substrate.

Here, a groove in which the substrate is preferably anchored is formed in the bottom supporter, and the groove is preferably slantwise formed in at least one side so that it provides a margin for anchoring the substrate.

In addition, the protruded groove, in which the lower part of the substrate supported and anchored, has round edges.

Also, the holding tray for substrate further includes at least one substrate alignment means formed to align the substrate on the frame.

Here, the substrate alignment means includes a reference element formed to provide a reference point in at least one edge on the frame when the substrate is anchored on the frame, and an adjustment element for adjusting the substrate so that the substrate can be in contact with the reference element in at least one edge on the frame when the substrate is anchored on the frame.

The reference element may be a reference pin formed in the reference point of at least one edge on the frame, and may be a reference hole where a reference rod can pass through the reference hole, and the adjustment element is an adjustment hole formed in at least one edge on the frame where an adjustment rod can pass through the adjustment hole.

Also, the substrate alignment means includes a through hole formed in at least two edges of the frame so that a substrate handler can pass through the through hole.

Also, the holding means for substrate is composed of clamps formed so that the substrate anchored on the frame can be held in at least one edge on the frame, and the clamp is a press member for pressing and closely holding the substrate to the frame with elasticity in at least one side of the substrate.

The press member includes an elastic means, and also includes a projection for insertion in its end so that it is elastically coupled with the frame by means of the elastic means, where a groove into which the projection for insertion is inserted is formed in the frame.

Here, the press member forms a coupling hole in which a coupling member is anchored, and suspends an elastic member in the coupling member to be elastically connected with the frame.

Also, the press member is formed in a manner that it can be continuously operated from a first position for press the substrate to a second position releasing the substrate, and vice versa. The continuous operation of the press member may be conducted by a substrate clamp pusher.

Here, the continuous operation of the press member is preferably conducted by a guide tool. The guide tool may include a guide protrusion formed in the projection for insertion received into the frame of the press member, and a guide groove formed in the frame to match the guide protrusion. In another embodiment, the guide tool may include a guide groove formed in the projection for insertion received into the frame of the press member, and a guide protrusion formed in the frame to match the guide groove.

Also, the continuous operation of the press member is conducted by moving the press member up or down while turning the substrate clamp pusher.

A substrate alignment system using the holding tray according to the present invention includes the holding tray for substrate, a mask pressed in one surface of the substrate held in the holding tray, and an alignment plate including a flat chuck formed to press the substrate and a driving means formed to be connected to the flat chuck to move the flat chuck so that the holding tray can be supported, held and aligned.

The substrate alignment system using the holding tray according to the present invention further includes at least one coupling unit in the holding tray and alignment plates which are coupled with each other to hold the holding tray.

Also, a method for aligning a substrate according to the present invention includes steps of anchoring a tray where the tray provided in the frame is anchored onto a tray support means; providing a substrate where the substrate is entered onto the tray; handling the substrate where the substrate entered onto the tray is supported by a substrate handler; anchoring the substrate where the substrate supported by the substrate handler is anchored onto the tray; aligning the substrate where the substrate is aligned by a substrate alignment means; holding the aligned substrate where the aligned substrate is held on the tray by a holding means for substrate; standing the tray where the tray onto which the substrate is anchored is stood from the tray support means; and inputting the substrate anchored tray where the tray is input into a chamber.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
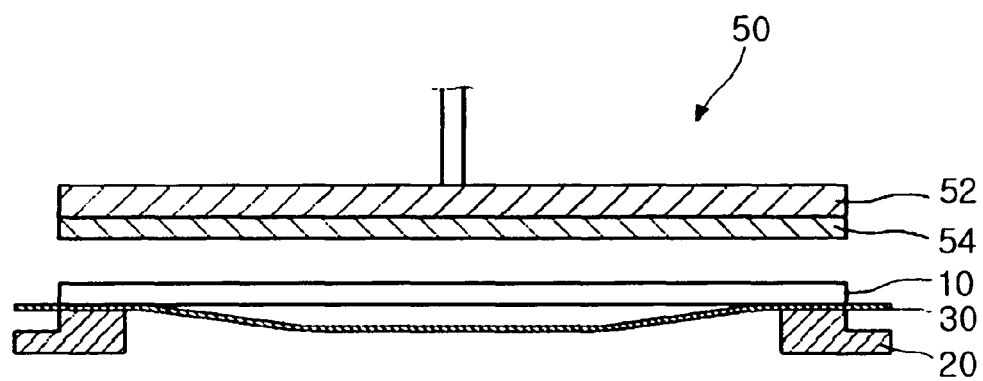
FIG. 1A is a cross sectional view showing a holding apparatus aligned to a substrate.
Figure 1B:
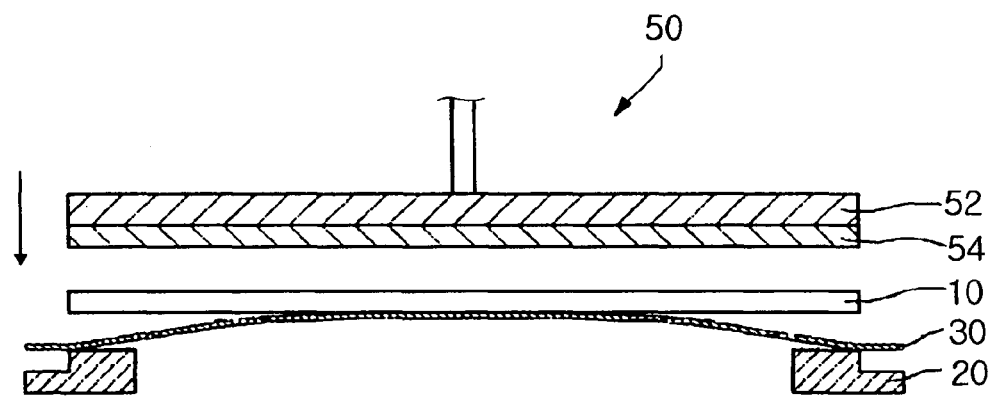
FIG. 1B is a cross sectional view showing the holding apparatus of FIG. 1A moving down to the substrate.

FIG. 1A is a cross sectional view showing a holding apparatus aligned to a substrate, and FIG. 1B is a cross sectional view showing the holding apparatus of FIG. 1A moving down to the substrate.

Referring to FIGS. 1A and 1B, a substrate 10 is mounted on a frame 20, and a mask 30 is positioned between the substrate 10 and the frame 20. The mask 30 has a desired pattern to be formed on the substrate 10. A holding unit 50 supporting the substrate 10 is positioned in the upper portion of the substrate 10. The holding unit 50 includes a magnetic plate 52 and a rubber magnet 54 stuck to a lower surface of the magnetic plate 52.

The holding unit 50 is positioned on the substrate 10 by means of robot return so as to hold the substrate 10, and the mask 30 is aligned to the substrate 10.

Then, the holding unit 50 moves down to the substrate 10, as shown in FIG. 1B. As the holding unit 50 descends, the mask 30, which is made of metal materials and positioned in the lower portion of the substrate 10, is attracted by a magnetic force, and the shape of the mask 30 is modified pushing a central region of the mask 30 toward the holding unit 50, and simultaneously closely pressing the substrate 10. Meanwhile, the rubber magnet 54 of the holding unit 50 is anchored on the rear surface of the substrate 10 to support the substrate 10. As described above, the deposition is conducted under this condition, where the mask 30 is in close contact with the substrate 10.

However, as the mask 30 approaches the holding unit 50 making the gap between the mask 30 and holding unit 50 narrower, the central region of the mask 30 moves first, and the movement causes a mismatch between the mask 30 and the holding unit 50. Accordingly, the central region of the mask 30 satisfactorily closely adheres to the substrate 10, while the edge of the mask 30 does not sufficiently closely adhere to the substrate 10. As a result, the pattern to be formed on the substrate 10 is not as accurate as desired, resulting in a poor product. Also, as the central region of the mask 30 moves up prior to the other region, there exists a problem that the substrate 10 is damaged by sliding movement when the mask 30 closely contacts the substrate 10.

Even when the substrate 10 contacts mask 30 after alignment process, there exists a fine gap between the substrate 10 and the mask 30, because the substrate 10 is not perfectly parallel to the mask 30, and therefore a fine slide is caused between the substrate 10 and the mask 30, lowering alignment precision, and therefore the alignment process should be repeated several times.

Hereinafter, preferable embodiments of a holding tray for substrate according to the present invention will be described with reference to the accompanying drawings.

Here, when one element is connected to another element, one element may be not only directly connected to another element but also indirectly connected to another element via another element. Further, irrelevant elements are omitted for clarity.

Figure 2A:
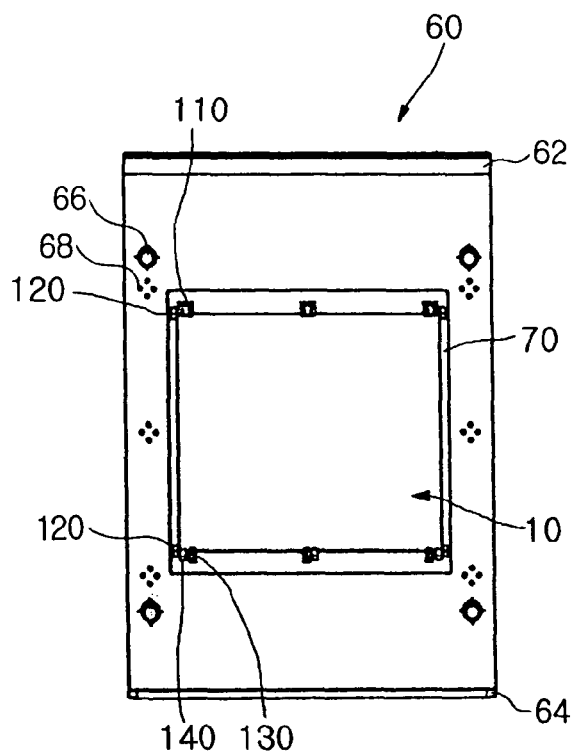
FIG. 2A is a front view showing a holding tray.
Figure 2B:
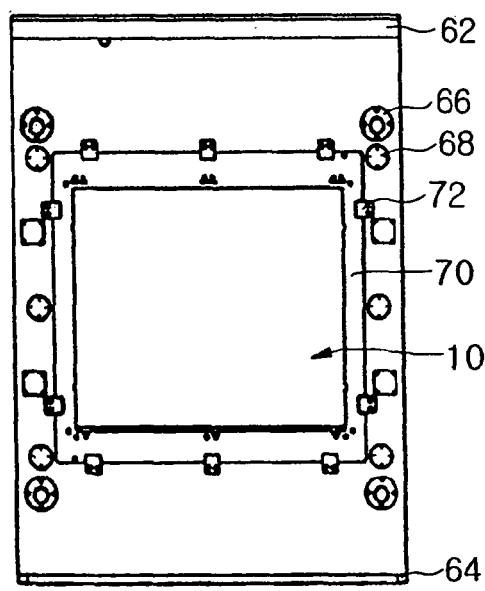
FIG. 2B is a rear view showing the holding tray.

FIG. 2A is a front view showing a holding tray according to an embodiment of the present invention. FIG. 2B is a rear view showing the holding tray according to the embodiment of the present invention, and FIG. 2C is a side view showing the holding tray according to the embodiment of the present invention.

Figure 2C:
FIG. 2C is a side view showing the holding tray.

Referring to FIGS. 2A to 2C, the holding tray according to the present invention includes a substrate 10 on which a deposition is made, and a tray 60 which holds the substrate 10 and is provided with holder members 66 and adhesion members 68.

The plate-type tray 60 is suitably constructed to hold the frame 70, and further constructed to have holding plates 72 to hold the frame. The frame 70 equipped in the tray 60 is suitably formed to hold the substrate 10, and first holding means 110, second holding means 120, third holding means 130, and fourth holding means 140 are formed to hold the substrate 10. A transporting means 64 is formed in a lower portion of the tray 60 so that the substrate 10 can be transported into a vacuum chamber, and a guide means 62 is formed in an upper portion of the tray 60 so that transportation of the substrate 10 is guided while being transported by the transporting means 64. A plurality of holder members 66 and adhesion members 68 are formed on the plate of the tray 60 along an edge of the frame 70, and openings are formed in the holder member 66.

Figure 3A:
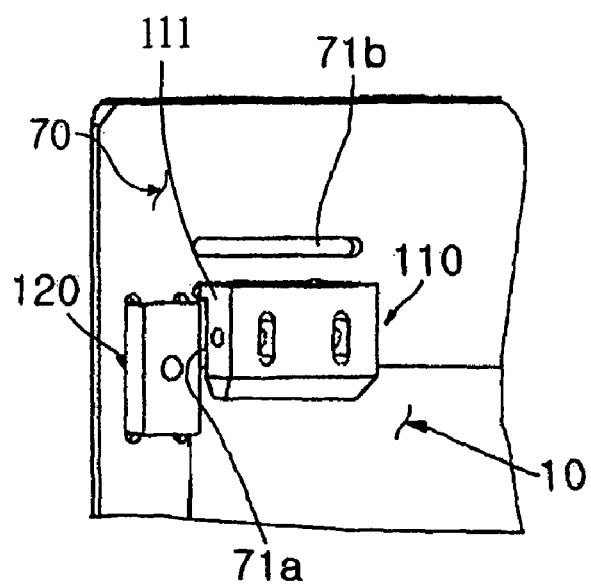
FIG. 3A is a perspective view showing a first holding means 110 holding an upper left corner of a substrate, and a second holding means 120 supporting the left side of the substrate.
Figure 3B:
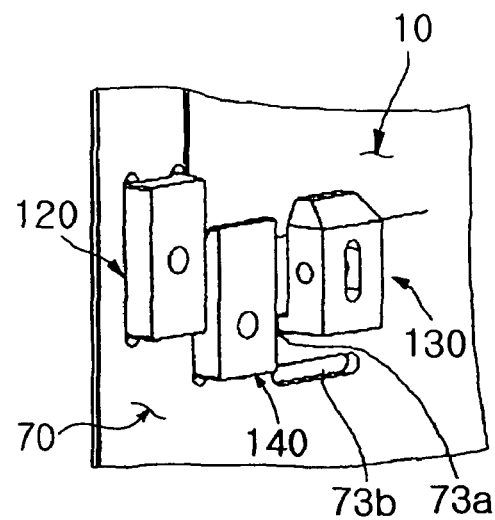
FIG. 3B is a perspective view showing a third holding means 130 and a fourth holding means 140 holding a lower left corner of a substrate, and a second holding means 120 supporting the left side of the substrate.
Figure 3C:
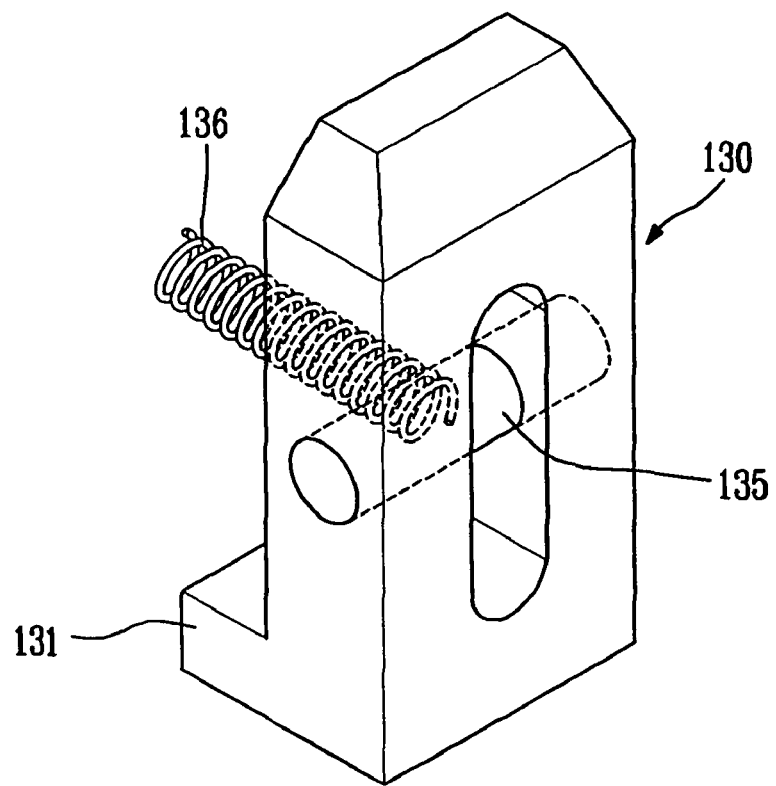
FIG. 3C is a perspective view showing the third holding means 130 in detail.

FIG. 3A is a perspective view showing a first and a second holding means 110 and 120 located at an upper left corner of a substrate of the holding tray according to the embodiment of the present invention. FIG. 3B is a perspective view showing a second, a third, and a fourth holding means located at a lower left corner of a substrate of the holding tray according to an embodiment of the present invention. FIG. 3C is a perspective view showing a third holding means 130, a coupling member 135 and an elastic means 136 of the holding tray according to the embodiment of the present invention.

Referring to FIGS. 3A to 3C, the first holding means 110 and the third holding means 130, which are positioned on the upper portion and the lower portion of the substrate 10, respectively, are formed to elastically hold and support the substrate 10. Here, elasticity, which is required for the holding means 110 and 130 to hold and to support the substrate 10, is accomplished through an elastic means 136. The elastic means 136 is included in the holding means 110 and 130, and the elastic means 136 is preferably a spring member. The elastic means 136 is formed in a manner to make a coupling member 135 being anchored and sustained in the coupling hole that is formed in the holding means 130, as shown in FIG. 3C. Only the third holding means 130 is described with reference to the accompanying drawings, but such a configuration is also applicable to the first holding means 110.

A first and a third projections 111 and 131 are formed in the first and third holding means 110 and 130, respectively, to be inserted into the protruded grooves 71a or 71b, and 73a or 73b, respectively, which are formed on the frame 70. The protruded grooves 71a and 71b formed in the upper portion of the frame 70 are formed to receive the first projection 111 of the first holding means 110. The first holding means 110 is inserted into the protruded groove 71a to press the substrate 10, and the holding means 110 is inserted into the protruded groove 71b to depress the substrate 10. The protruded grooves 73a and 73b formed in the lower portion of the frame 70 are formed to receive the third projection 131 of the third holding means 130. The holding means 130 is coupled to the protruded groove 73a to press the substrate 10, and coupled to the protruded groove 73b to depress the substrate 10.

When the substrate 10 is being mounted in the frame 70, the elastic means of the holding means 110 and 130 are first stretched under tension, and after the substrate 10 is completely anchored in the frame 70, the elastic means are released having the holding means 110 and 130 press the substrate 10. By these steps, the substrate 10 is anchored to the frame 70.

Also, the second holding means 120 positioned in the side of the substrate 10 is formed to be held through grooves (not shown) formed in the frame 70, and a step height is formed to receive thickness of the substrate 10 so that the substrate 10 can be received in a direction into which the substrate 10 is charged. That is to say, the holding means 120 of the side of the substrate forms the protruded grooves along with the frame 70 while adhering to the frame 70, and therefore thickness of the substrate 10 is received into the protruded grooves. When the substrate 10 is mounted on the frame 70, the substrate 10 is received into the step height of the holding means 120, namely the protruded groove formed along with the frame 70. The holding means 120 assists supporting the substrate 10 when the substrate 10 is held and supported by the frame 70 via the aforementioned holding means 110 and 130.

Figure 4A:
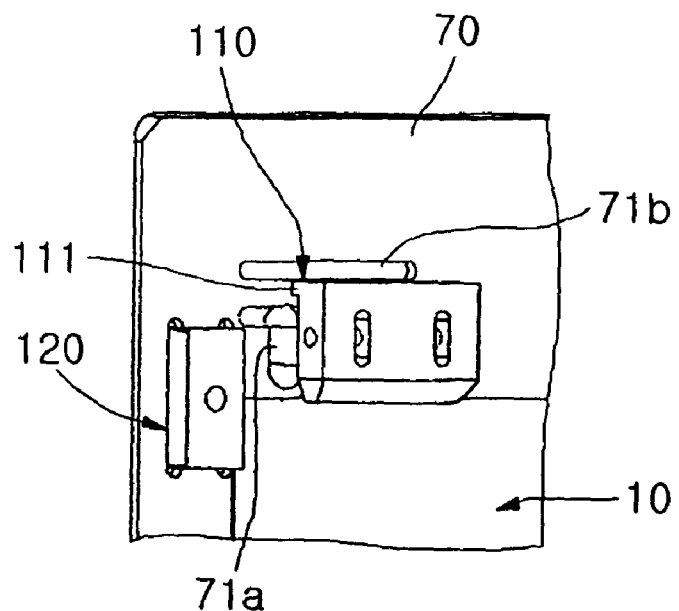
FIG. 4A is a perspective view showing the first holding means 110 before being coupled with the frame.
Figure 4B:
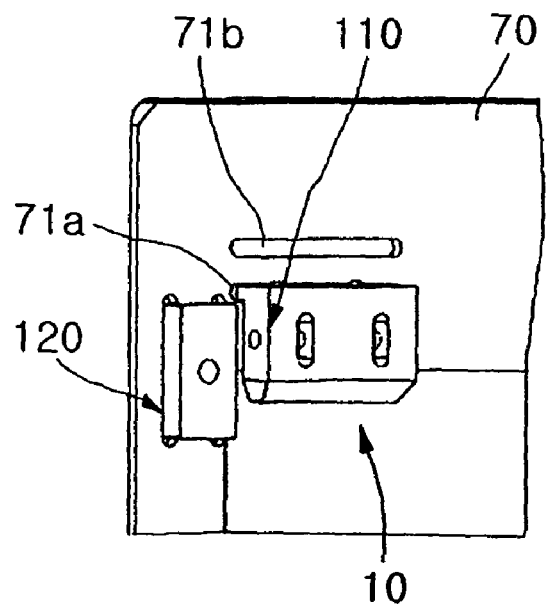
FIG. 4B is a perspective view showing the first holding means 110 after being coupled with the frame.

FIG. 4A is a perspective view showing the first and second holding means 110 and 120 of the holding tray according to the embodiment of the present invention before the holding means 110 and 120 are coupled with the frame. FIG. 4B is a perspective view showing the holding means 110 and 120 of the holding tray according to the embodiment of the present invention after the holding means 110 and 120 are coupled with the frame.

Referring to FIGS. 4A and 4B, when the substrate 10 is held in the frame 70, the substrate 10 is supported by the first holding means 110 in the upper portion of the substrate 10. The holding means 110 formed to hold the upper portion of the substrate 10 is formed to have a first projection 111 in somewhere of the holding means 110 in a manner that the projection 111 can be received into the protruded groove 71a or 71b formed in the frame 70. The protruded groove 71a formed in the frame 70 receives an elastic means that is included in the holding means 110, and are formed to hold one end of the elastic means.

When the substrate 10 is being held, the first holding means 110 is pulled in a direction away from the frame 70 under tension provided by the elastic means. When a side of the substrate 10 is completely charged into the protruded groove of the second holding means 120, the first holding means 110 is released, relieving the tension of the elastic means, to hold the substrate 10. The holding means 110 engaged with the elastic means is to be held and supported by pressure of the elastic means, and closely adheres to the charged substrate 10 due to the tension of the elastic means.

Figure 4C:
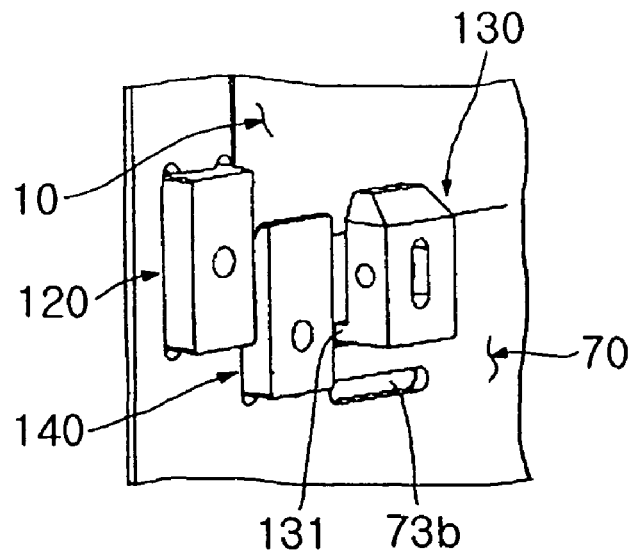
FIG. 4C is a perspective view showing that the third holding means 130 when the third holding means is coupled with the frame.
Figure 4D:
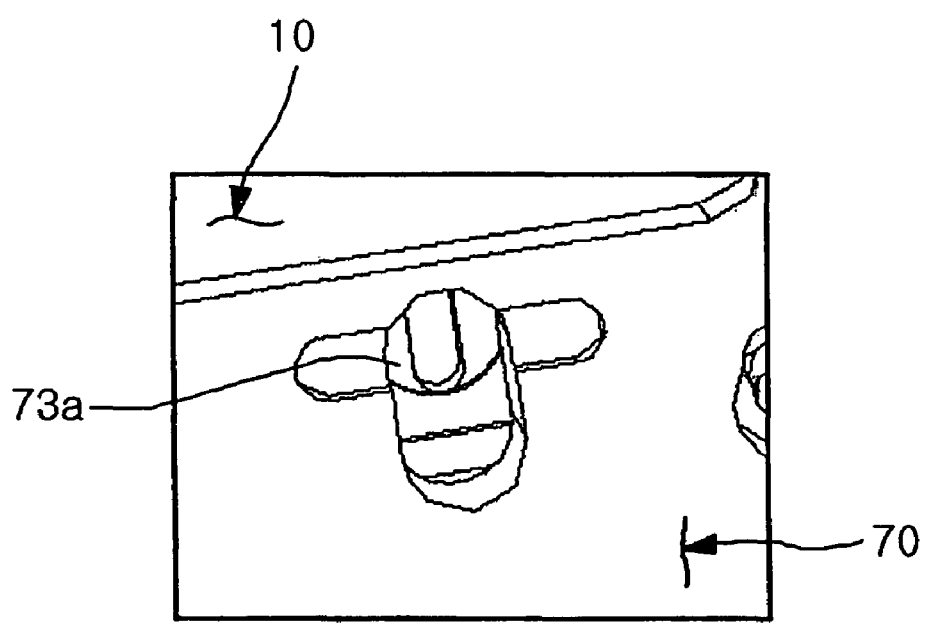
FIG. 4D is a perspective view showing a protruded groove formed in a rear surface of the frame of FIG. 4C.

FIG. 4C is a perspective view showing the third holding means of the holding tray according to an embodiment of the present invention when the third holding means is coupled with the frame. FIG. 4D is a cross sectional view showing a groove formed in a rear surface of the cross sectional view shown in FIG. 4C.

Referring to FIGS. 4C and 4D, when the substrate 10 is held in the frame 70, the substrate 10 is supported by the third holding means 130 in the lower portion of the substrate 10. The holding means 130 formed to hold the lower portion of the substrate 10 is formed to have a third projection 131 in somewhere of the holding means 130 in a manner that the projection 131 can be received into the protruded groove 73a or 73b formed in the frame 70. The protruded groove 73a and 73b formed in the frame 70 receives the elastic means that is included in the holding means 130, and the protruded groove 73a is formed through the rear surface of the holding tray where the holding means 130 is pressured to the frame 70. The protruded groove 73a has a shape for holding one end of the elastic means. Also, coupling holes are formed in the first and third holding means 110 and 130, where the other end of the elastic means anchored. And the coupling member 135 (see FIG. 3C) is formed in the elastic means. The other end of the elastic means is sustained to the coupling member 135 to be anchored to the coupling hole. Here, only the protruded groove 73a is described with reference to the accompanying drawings, but such a configuration is also applicable to the protruded groove 71a of the specification. The elastic means is coupled only with the protruded groove 73A (not with 73B). When the holding means 130 holds the substrate, both of the elastic means and the projection 131 are coupled with the groove 73a. When the holding means releases the substrate, the elastic means is coupled with the groove 73a, but the projection is coupled with the groove 73b. At this time, the elastic means is expected or compressed in the state that the coupling member 135 is fixed to a predetermined part of a vertical opening formed in the holding means 130. Alternatively, the coupling member may move up and down through the vertical opening when the projection of the holding means moves between the grooves 73a and 73b, so that the holding means freely moves up and down even when the elastic means is permanently coupled with the groove 73A.

Figure 5A:
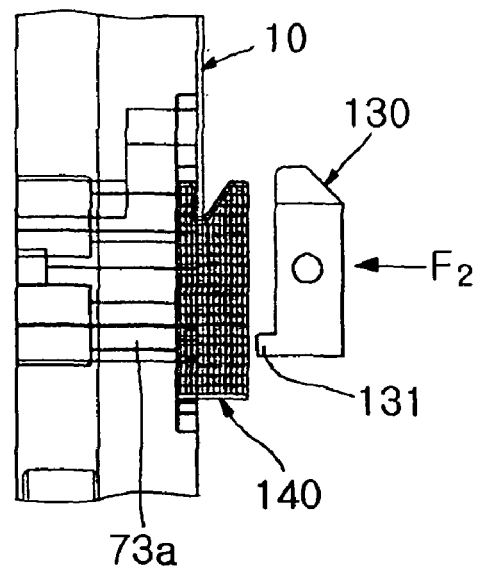
FIG. 5A is a side view showing the third holding means 130 before being coupled with the tray.
Figure 5B:
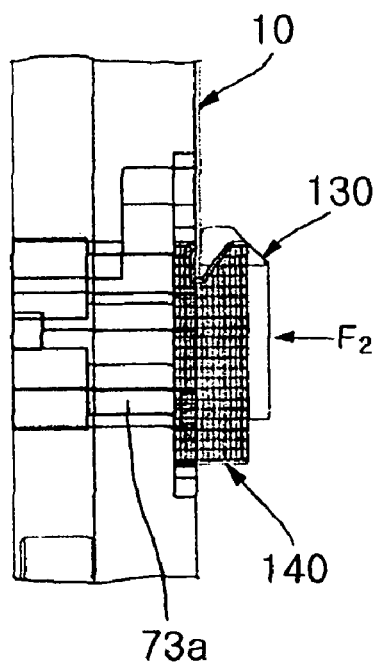
FIG. 5B is a side view showing the third holding means 130 after being coupled with the tray.
Figure 5C:
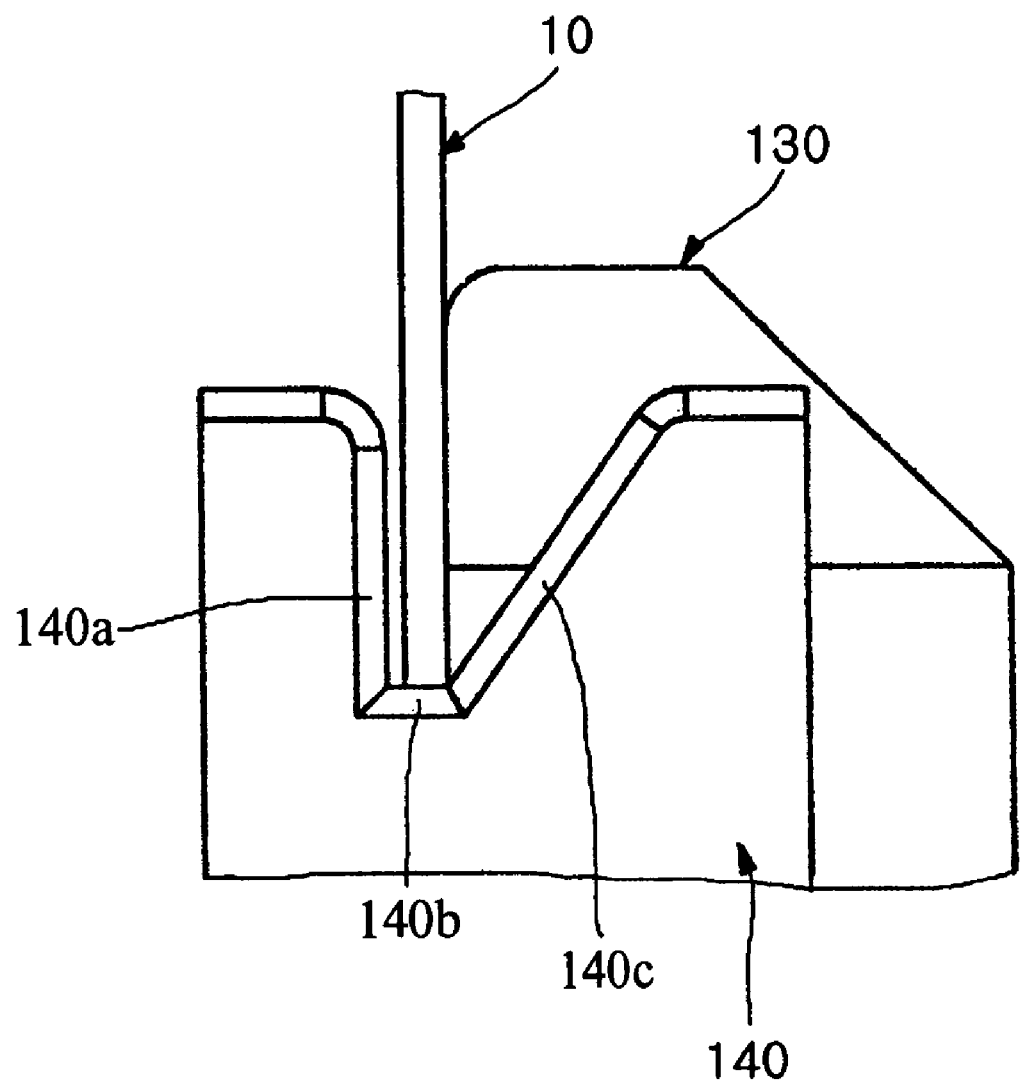
FIG. 5C is a cross sectional view showing the third holding means 130 and the fourth holding means 140.

FIG. 5A is a side view showing the third holding means 130 of the holding tray according to an embodiment of the present invention before the holding means 130 is coupled with the tray. FIG. 5B is a side view showing the third holding means 130 of the holding tray according to an embodiment of the present invention after the holding means 130 is coupled with the tray. FIG. 5C is a cross sectional view showing the third holding means 130 and fourth holding means 140 of the holding tray according to an embodiment of the present invention.

Referring to FIGS. 5A to 5C, when the substrate 10 is held in the frame 70, the substrate 10 is supported by the third holding means 130 in the lower portion of the substrate 10. The holding means 130 formed to hold the lower portion of the substrate 10 is formed to have the third projection in somewhere of the holding means 130 in a manner that it can be received into the protruded groove 73a or 73b formed in the frame 70. The protruded grooves 73a and 73b formed in the frame 70 receive the elastic means further included in the holding means 130, and is formed to hold one end of the elastic means.

When the substrate 10 is being held, the third holding means 130 is pulled in a direction away from the frame 70 under tension provided by the elastic means. When a side of the substrate 10 is completely charged into the protruded groove of the second holding means 120, the third holding means 130 is released, relieving the tension of the elastic means, to hold the substrate 10. The holding means 130 engaged with the elastic means is to be held and supported by pressure of the elastic means, and closely adheres to the charged substrate 10 due to the tension of the elastic means.

Referring to FIGS. 5A to 5C again, when the substrate 10 is held in the frame 70, the substrate 10 is supported by the fourth holding means 140 in the lower portion of the substrate 10. The holding means 140 formed to support the lower portion of the substrate 10 is formed to be held in grooves formed in the frame 70. The holding means 140 has protruded grooves in the upper portion to support the substrate 10. As shown in FIG. 5C, the protruded grooves include a lower surface 140b having a predetermined spacing, a vertical side 140a formed perpendicular to the lower surface 140b, and an inclined side 140c formed to be inclined to the vertical side 140c. The protruded groove has rounded edges so that the substrate 10 is smoothly charged into the opening portion of the protruded groove formed to support the substrate 10.

When the substrate 10 is mounted in the frame 70, the lower portion of the substrate 10 is anchored onto the holding means 140. Describing more accurately, the lower portion of the substrate 10 is anchored to the lower surface 140b of the protruded groove formed in the holding means 140.

The vertical side 140a of the protruded groove is formed to closely adhere to the frame 70, and then the substrate 10 closely adheres to the vertical side 140a. That is to say, the substrate 10 pressed by the holding means 140 closely adhered to be parallel to the vertical side 140a.

The lower surface 140b of the holding means 140, which is formed to provide the substrate 10 with the gap, supports the substrate 10, and the gap has a margin in a manner that the substrate 10 can be coupled to or separated from the frame 70 while being supported by the lower surface 140b.

The inclined side 140c, which is formed to be inclined to the vertical side 140a of the holding means 140, is downwardly inclined at the side of the frame 70 to allow a margin that would guide the substrate 10 when the substrate 10 is anchored into the protruded groove of the holding means 140

Hereinafter, another embodiment of the holding tray for substrate according to the present invention will be described in detail with reference to the accompanying drawings.

Figure 6A:
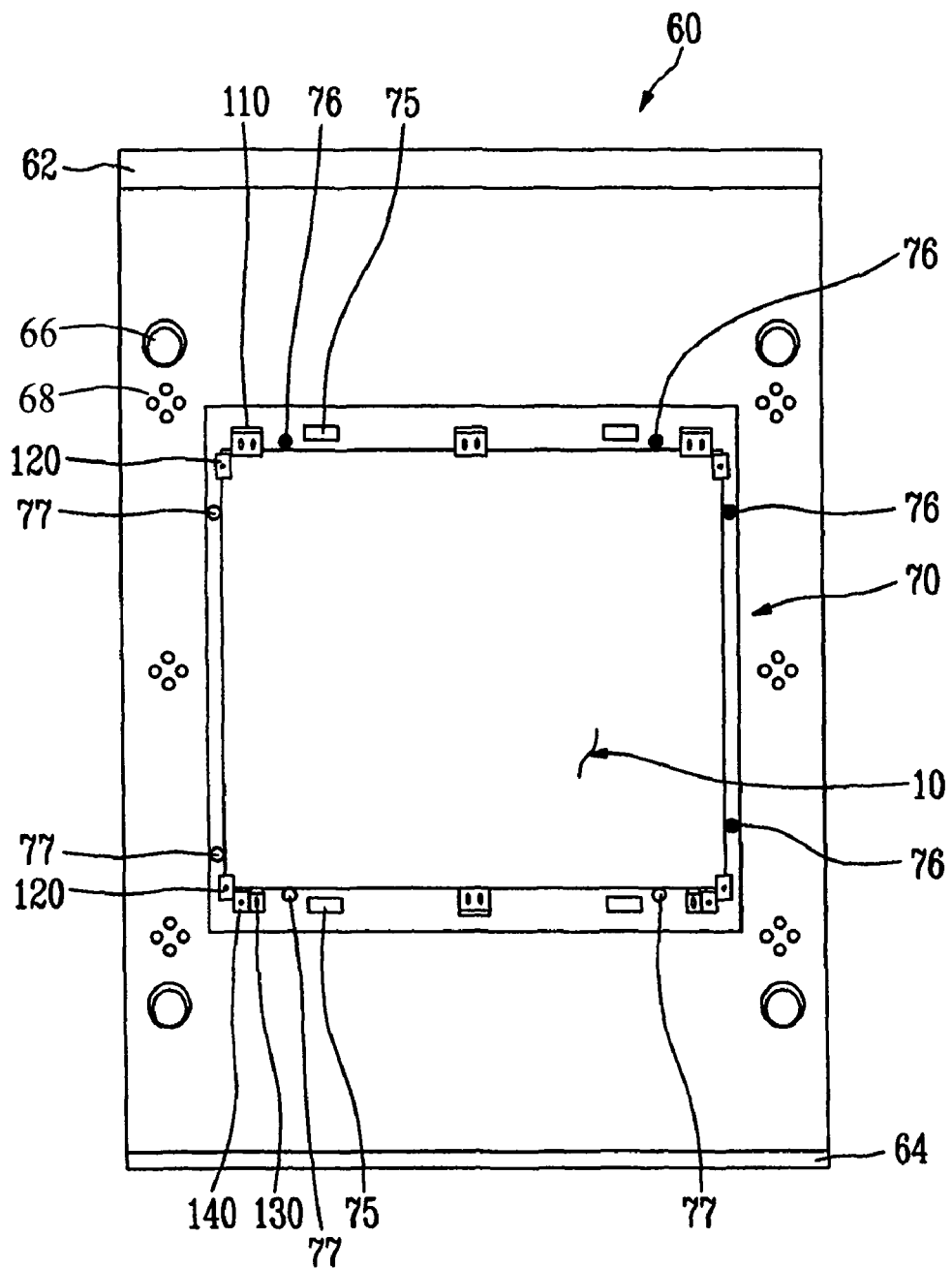
FIG. 6A is a front view showing the holding tray constructed as one embodiment of the present invention.
Figure 6B:
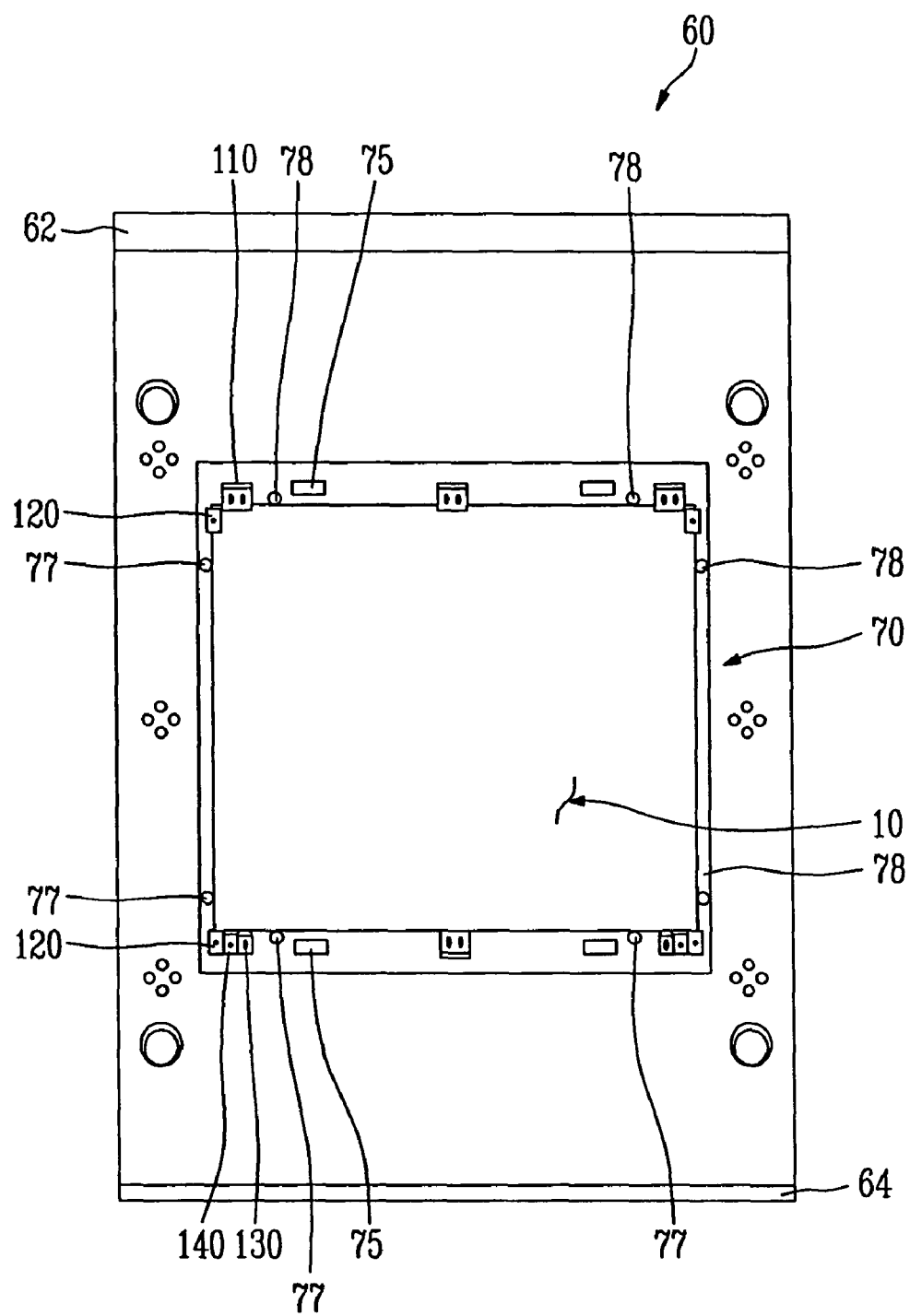
FIG. 6B is a front view showing the holding tray constructed as a modified embodiment of the present invention.

FIG. 6A is a front view showing a holding tray for substrate according to an embodiment of the present invention. FIG. 6B is a front view showing a holding tray for substrate according to a modified embodiment of the present invention.

A plate type tray 60 is suitably formed to receive a frame 70, and a holding plate for frame (not shown) is additionally formed to be held in the tray 60. The frame 70 received into the tray 60 is suitably formed to receive a substrate 10, and the holding means for substrate 110, 120, 130, and 140 are formed to hold the substrate 10. A transporting means 64 is formed in the lower portion of the tray 60 so that the substrate 10 can be transported to a vacuum chamber, and a guide means 62 is formed in the upper portion of the tray 60 so that the transportation of the substrate 10 can be guided while being transported by the transporting means 64. A plurality of holder members 66 and adhesion members 68 are formed on the plate of the tray 60 along edges of the frame 70, and openings are formed in the holder member 66.

Also as shown in FIG. 6A, in order to align the substrate anchored onto the frame 70 of the tray 60, a plurality of reference pins 76 are formed on the frame 70. A plurality of the reference pins 76 functions as a reference point that provides a suitable position of the substrate 10 when the substrate 10 is anchored onto the frame 70. Also, four adjustment holes 77 are formed on the frame 70. Adjustment means (not shown in the present drawings) pass through the four adjustment holes 77 in a manner that the substrate 10 can be moved to a desired position so that the edge of the substrate 10 is in exact contact with the reference pins 76. The adjustment means (not shown in the present drawings) may pass through the adjustment hole 77 from the rear surface of the tray 60, and then the position of the substrate 10 may be adjusted, based on the reference pins 76.

FIG. 6B shows a modified example of the configuration shown in FIG. 6A. A plurality of reference holes 78 may be formed on the frame 70 as the reference means. When such a reference hole 78 is formed, the reference means (not shown in the present drawings) pass through the reference hole 78 from the rear surface of the tray 60 to provide reference points, when the substrate 10 is anchored on the frame 70. Then, the adjustment means may be used by means of the adjustment hole 77 as described above to adjust the position of the substrate 10.

Reference elements 76 or 78 are formed on at least one edge of the frame 70 to provide reference points for the substrate 10. On the other edge of the frame 70 on which the reference elements 76 or 78 are not formed, the adjustment holes 77 are formed.

Preferably in the rectangular frame 70, two reference elements 76 or 78 are formed in two nearby edges, and two adjustment holes 77 are formed in the other two edges.

Four through holes 75 are formed on the frame 70 of the tray 60 in a manner that a substrate handler, which will be described later, can pass through the through holes. The substrate handler passes through the tray 60 from the rear surface of the tray 60 via the through holes 75 to anchor the substrate 10 onto the frame 70 in the front of the tray 60. In order to steadily anchor the substrate 10, two through holes 75 are formed on each of two edges of the frame 70 in this embodiment.

The frame 70 received into the tray 60 is suitably formed to receive the substrate 10, and the holding means for substrate 110, 120, 130, and 140 are formed to hold the substrate 10.

Figure 7A:
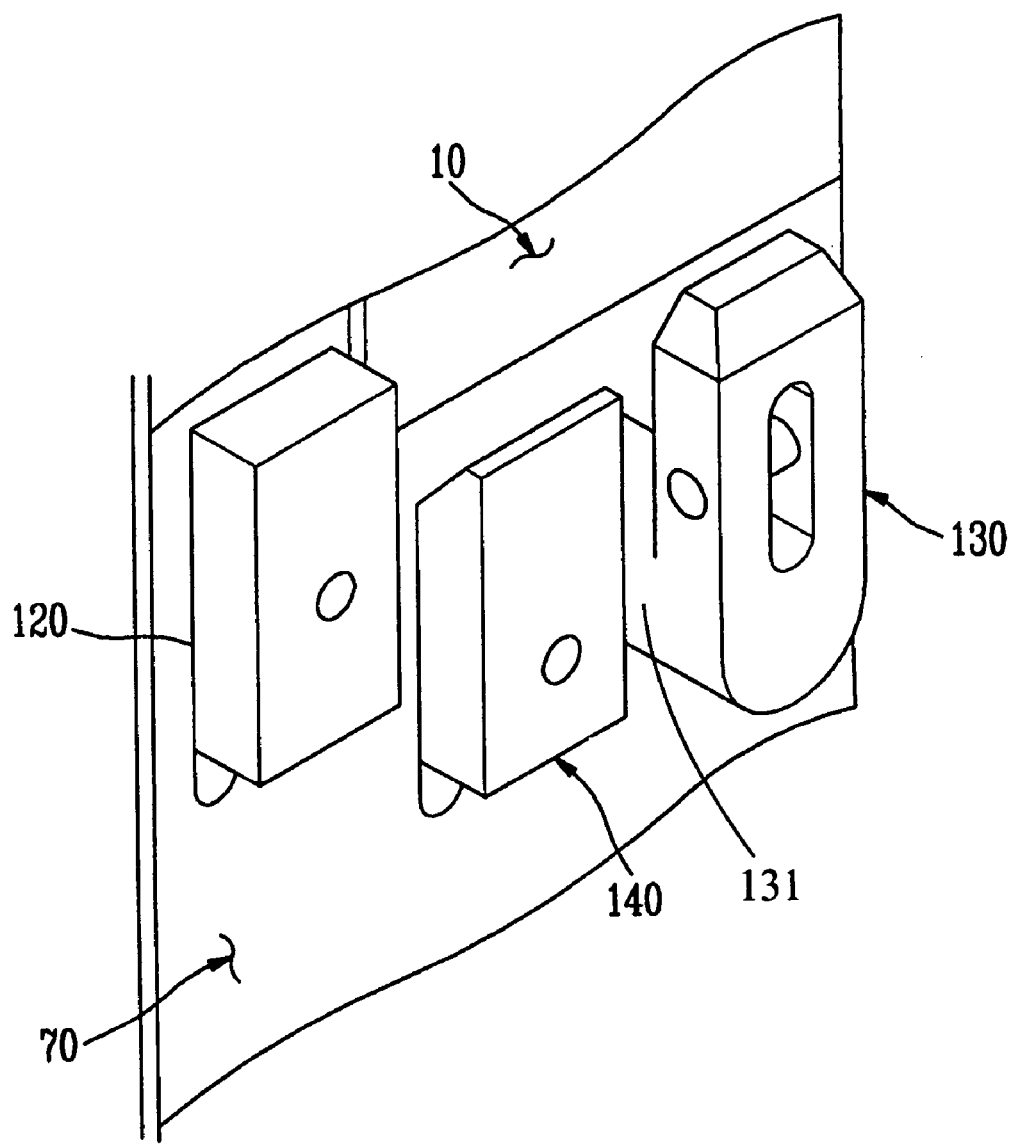
FIGS. 7A and 7B are partial perspective views showing operation of the third holding means.
Figure 7B:
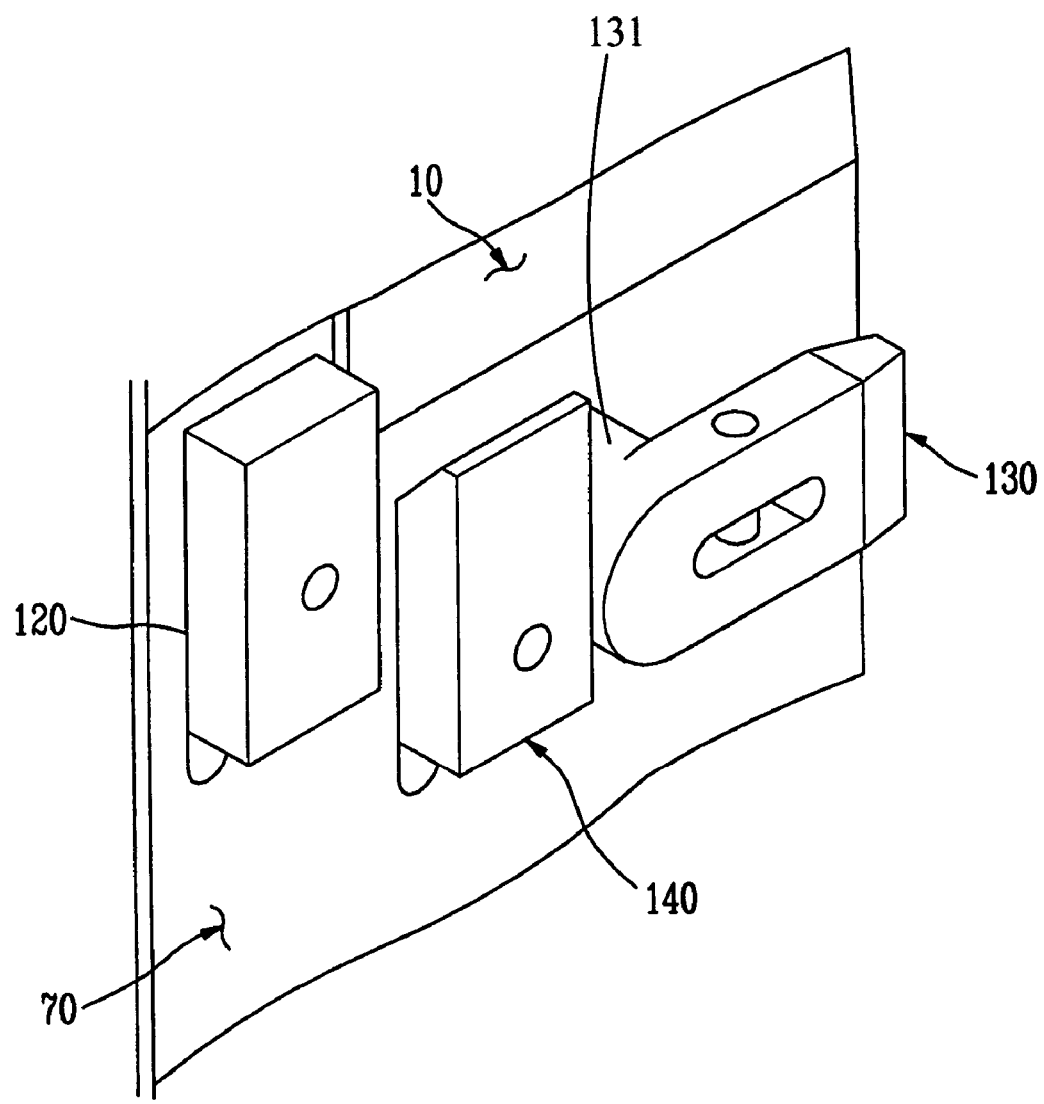

FIGS. 7A and 7B are partial perspective views showing operation of the holding means according to an embodiment of the present invention.

The second holding means 120 positioned in the side of the substrate 10 is formed to be held in the grooves (not shown) formed in the frame 70, and a step height is formed to receive thickness of the substrate 10 so that the substrate 10 can be received in a direction into which the substrate 10 is charged. That is to say, the holding means for substrate 120 of the side surface forms the protruded grooves along with the frame 70 while it adheres to the frame 70, and therefore thickness of the substrate 10 is received into the protruded grooves. When the substrate 10 is mounted on the frame 70, the substrate 10 is received into the step height of the second holding means 120, namely the protruded groove formed along with the frame 70. The holding means for substrate 120 assists the substrate 10 when the substrate 10 is held and supported to the frame 70 by the aforementioned holding means for substrate 110 and 130.

The third holding means 130 positioned in the lower portion of the substrate 10 is formed to hold and support the substrate 10 with elasticity. Here, the elasticity, with which the holding means 130 hold and support the substrate 10, is accomplished by an elastic means 136 that is further included in the holding means 130, and the elastic means 136 is preferably a spring member.

When the substrate 10 is being mounted in the frame 70, the elastic means of the third holding means 130 is first stretched under tension, and after the substrate 10 is completely anchored in the frame 70, the elastic means are released having the holding means 130 press the substrate 10. By these steps, the substrate 10 is anchored to the frame 70.

A projection 131 is formed in the holding means 130 to be inserted into the protruded grooves formed on the frame 70. The projection 131 is formed to elastically hold the holding means 130 on the frame 70 by means of the aforementioned elastic means 136.

The holding means 130 functions as a clamp, and presses and holds the substrate 10 closely to the frame 70 with elasticity when the substrate 10 is anchored onto the frame 70.

The third holding means 130 is formed to be engaged in a first position (FIG. 7A) or a second position (FIG. 7B). The first position (FIG. 7A) presses the substrate 10 on the frame 70, and the second position (FIG. 7B) releases the substrate 10 so that the third holding means 130 does not interfere the input of the substrate 10 when the substrate 10 is charged into the frame 70. The continuous operation of such a holding means 130 is achieved by employing a substrate clamp pusher (not shown).

Figure 8A:
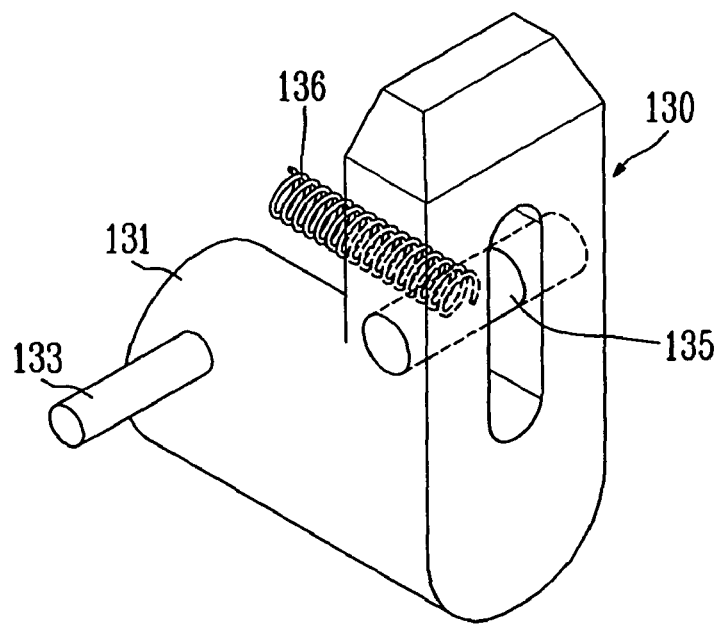
FIGS. 8A and 8B are perspective views showing one example of the third holding means of FIGS. 7A and 7B.
Figure 8B:
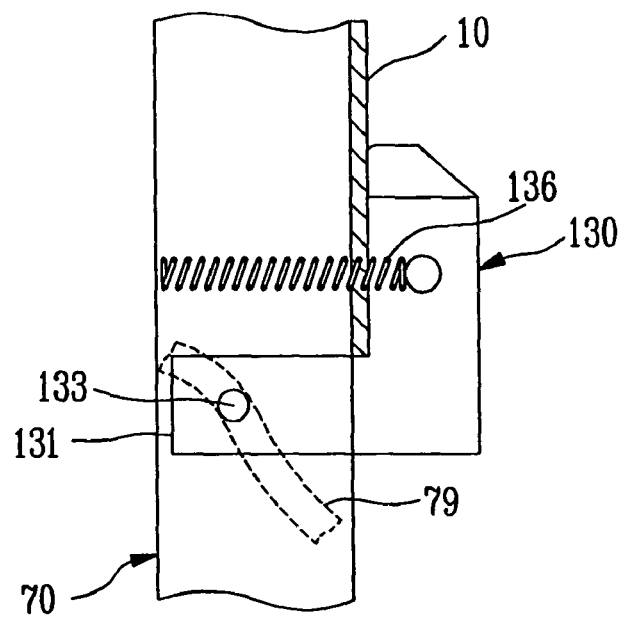

One example of such a third holding means 130 is shown in FIG. 8A and FIG. 8B. The elastic means 136 is formed to be sustained to the coupling member 135 so that the coupling member 135 can be anchored to the coupling hole formed in the third holding means 130.

The continuous operation to the aforementioned first position and the aforementioned second position of the third holding means 130 may be conducted through the guide apparatus. At least one guide protrusion 133 is formed on the projection for insertion 131 of the third holding means 130. A guide groove 79 is formed inside the frame 70. More specifically, the projection 131 of the third holding means 130 is inserted into a portion of inside of the protruded groove of the frame 70, so that it can be matched with the guide protrusion 133 formed on the projection for insertion 131 of the third holding means 130. The guide groove 79 formed in the frame 70 is formed so that the third holding means 130 can move to the aforementioned first position and the aforementioned second position, respectively, when the guide protrusion 133 of the third holding means 130 moves along with the guide groove 79. That is to say, the guide groove 79 is spirally formed in the inner part of the cylindrical protruded groove formed to receive the cylindrical projection for insertion 131, and therefore the guide groove 79 allows the third holding means 130 to move from the first position to the second position, and vice versa, when the guide protrusion 133 moves along the guide groove 79.

In addition to the aforementioned guide apparatus, although not shown in the drawings, it is also possible to form the guide grooves 79 in the projection 131 of the third holding means 130. Then the guide protrusion 133 is formed inside the protruded groove of the frame 70. The technical object of this embodiment is the same as described in the aforementioned guide apparatus.

Figure 9A:
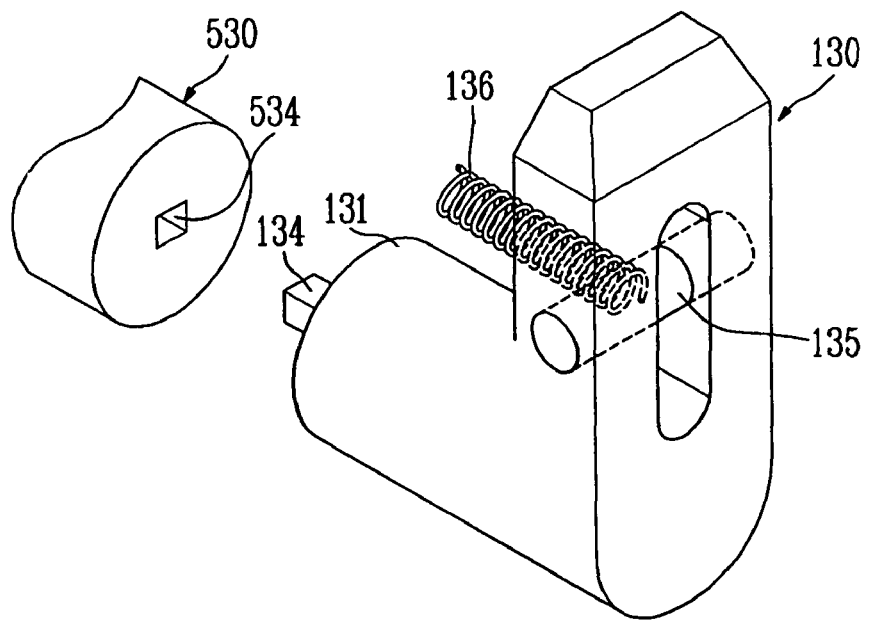
FIGS. 9A and 9B are perspective views showing another example of the third holding means of FIGS. 7A and 7B.
Figure 9B:
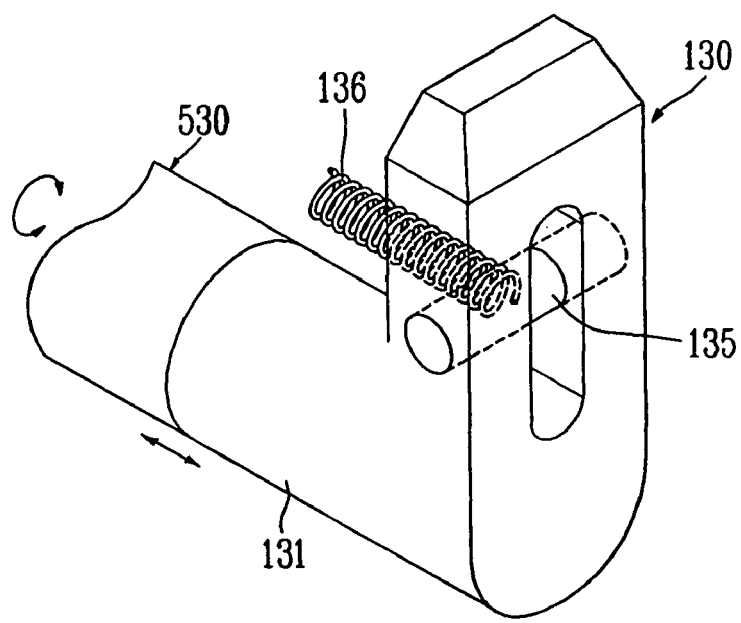

In another embodiment, the continuous operation of the third holding means 130 from the first position to the second position, and vice versa, may be conducted by fitting the third holding means 130 to a substrate clamp pusher 530, as shown in FIG. 9A and FIG. 9B.

A convex 134 is formed in the projection 131 of the third holding means 130. The convex 134 is formed in a section where the projection 131 is in contact with the substrate clamp pusher 530. A concave 534 is formed in the substrate clamp pusher 530, more specifically in the section where the substrate clamp pusher 530 is in complete contact with the projection 131 of the third holding means 130 so as to correspond to the convex 134. Preferably, when the convex 134 and the concave 534 are fitted to each other, the section in which the convex 134 of the third holding means 130 is formed, and the section in which the concave 534 of the substrate clamp pusher 530 is formed, are in complete contact with each other, because the convex 134 and the concave 534 are designed as the same plate type.

The completely fitted third holding means 130 is engaged with a linear motion and a rotary motion of the substrate clamp pusher 530 and therefore the continuous operation moving between the first position and the second position is accomplished.

Only the third holding means 130 is described with reference to the accompanying drawings, but such a configuration is also applicable to the first holding means 110 of the specification.

Hereinafter, a substrate alignment system using the holding tray for substrate according to an embodiment of the present invention will be described in detail with reference to the accompanying drawings.

Figure 10A:
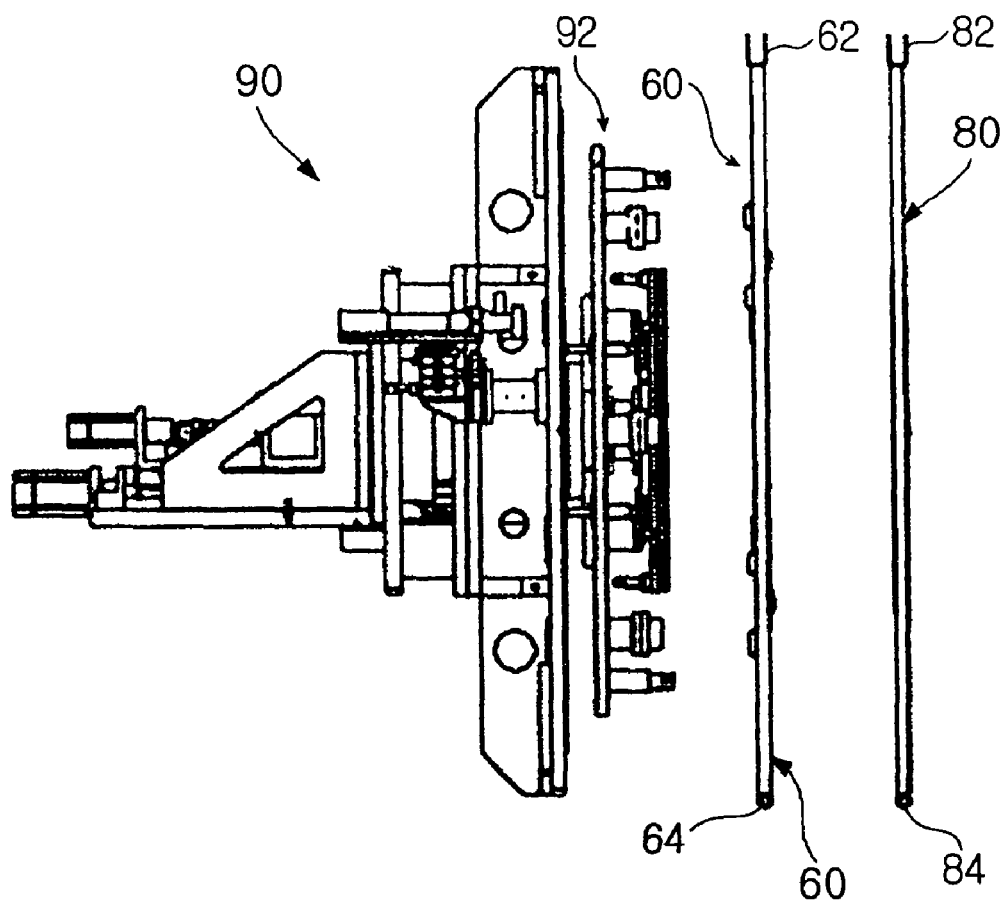
FIG. 10A is a cross sectional view showing arrangements of the holding tray, the mask tray, and the chuck plate of the substrate alignment system.
Figure 10B:
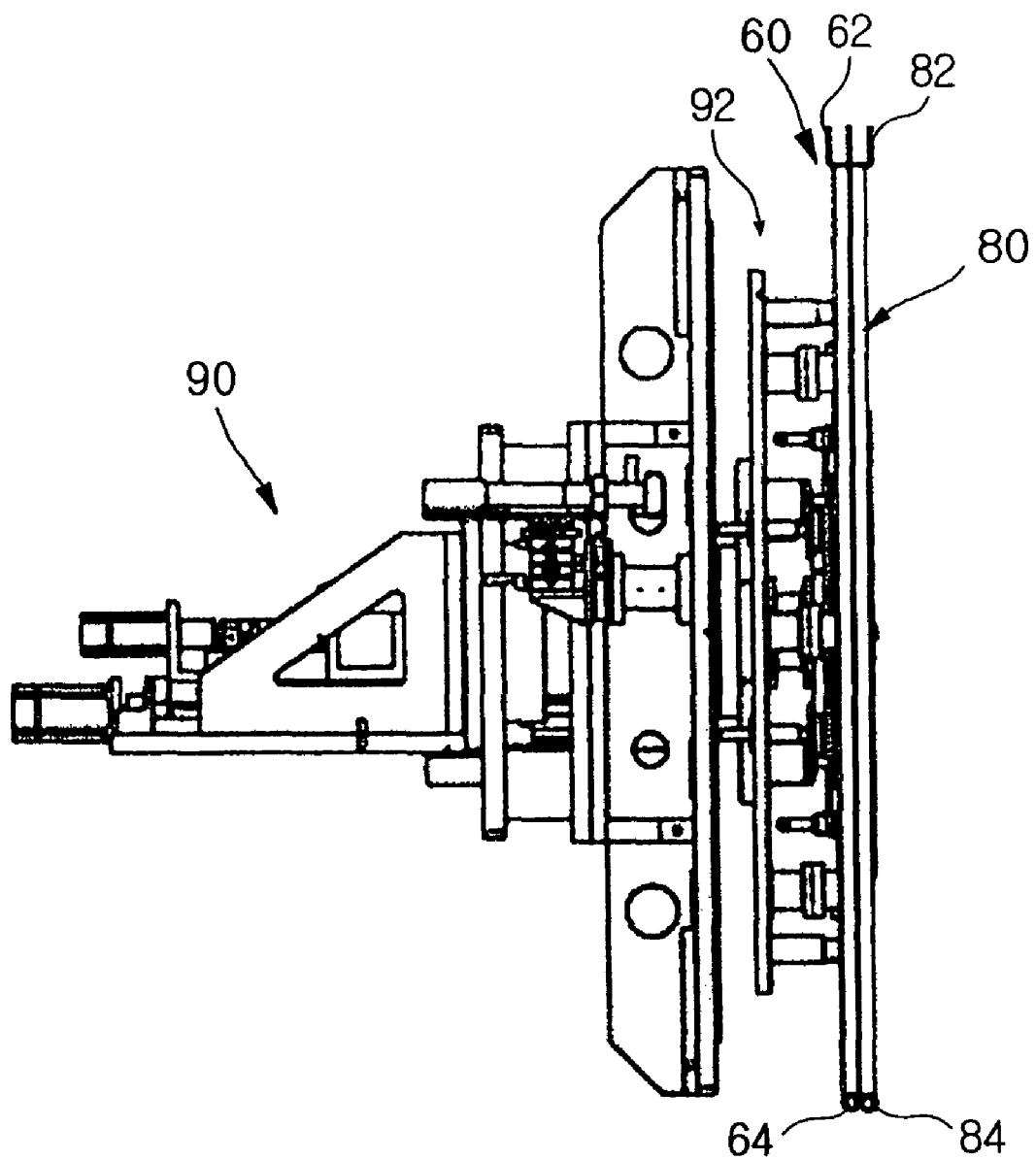
FIG. 10B is a cross sectional view showing coupling of the holding tray, the mask tray, and the chuck plate of the substrate alignment system.

FIG. 10A is a cross sectional view showing arrangement of the holding tray for substrate, the mask tray, and the chuck plate of the substrate alignment system according to an embodiment of the present invention. FIG. 10B is a cross sectional view showing coupling of the holding tray for substrate, the mask tray, and the chuck plate of the substrate alignment system according to an embodiment of the present invention.

Referring to FIGS. 10A and 10B, the tray 60 is arranged prior to a position in which a chuck 92 of an alignment plate 90 is positioned so as to carry out a vacuum deposition on the substrate 10 held in the tray 60. Also, a mask tray 80 for forming a pattern in the substrate 10 is arranged prior to the tray 60 upon the vacuum deposition. That is to say, the tray 60 is arranged between the mask tray 80 and the alignment plate 90. Then, the tray 60 is coupled to the chuck 92 of the alignment plate 90. The mask tray 80 is coupled to the tray 60 at the opposite side where the chuck 92 of the alignment plate 90 is coupled to the tray 60. A shadow mask 30 (see FIG. 12B), in which the pattern is formed on a surface where the deposition takes place, is coupled to the mask tray 80.

Before a deposition is carried out, alignment should be accomplished between the substrate 10 mounted on the tray 60, and the shadow mask mounted on the mask tray 80. For such an alignment, the alignment plate 90 is formed to move the tray 60 in all directions in a manner that the tray 60 on which the substrate 10 is mounted can be aligned with the shadow mask mounted on the mask tray 80.

Reference numeral 82 represents the guide means of the mask tray, and reference numeral 84 represents the transporting means of the mask tray.

Figure 11A:
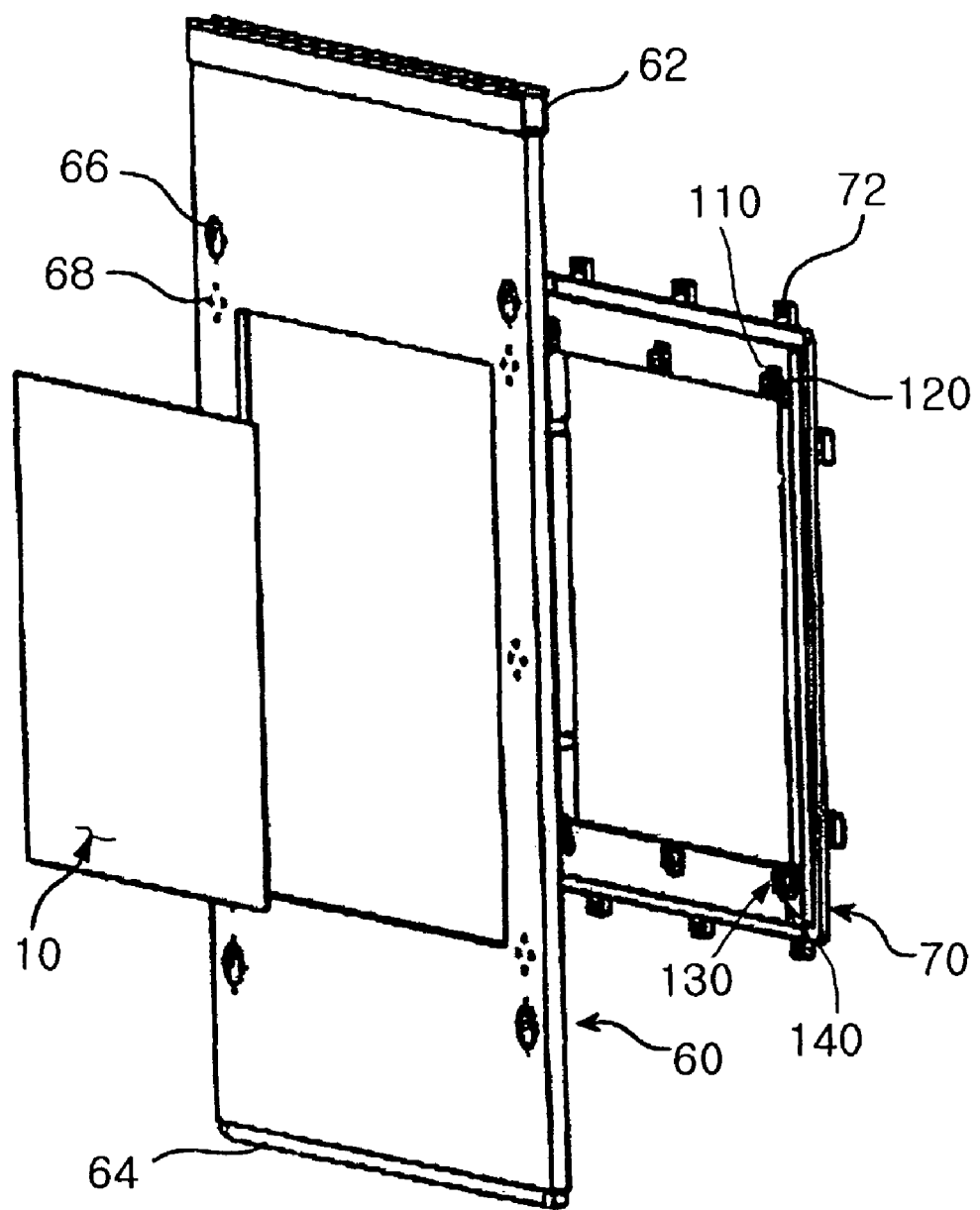
FIG. 11A is a perspective view showing a substrate, a substrate frame and a tray in the holding tray of the substrate alignment system.
Figure 11B:
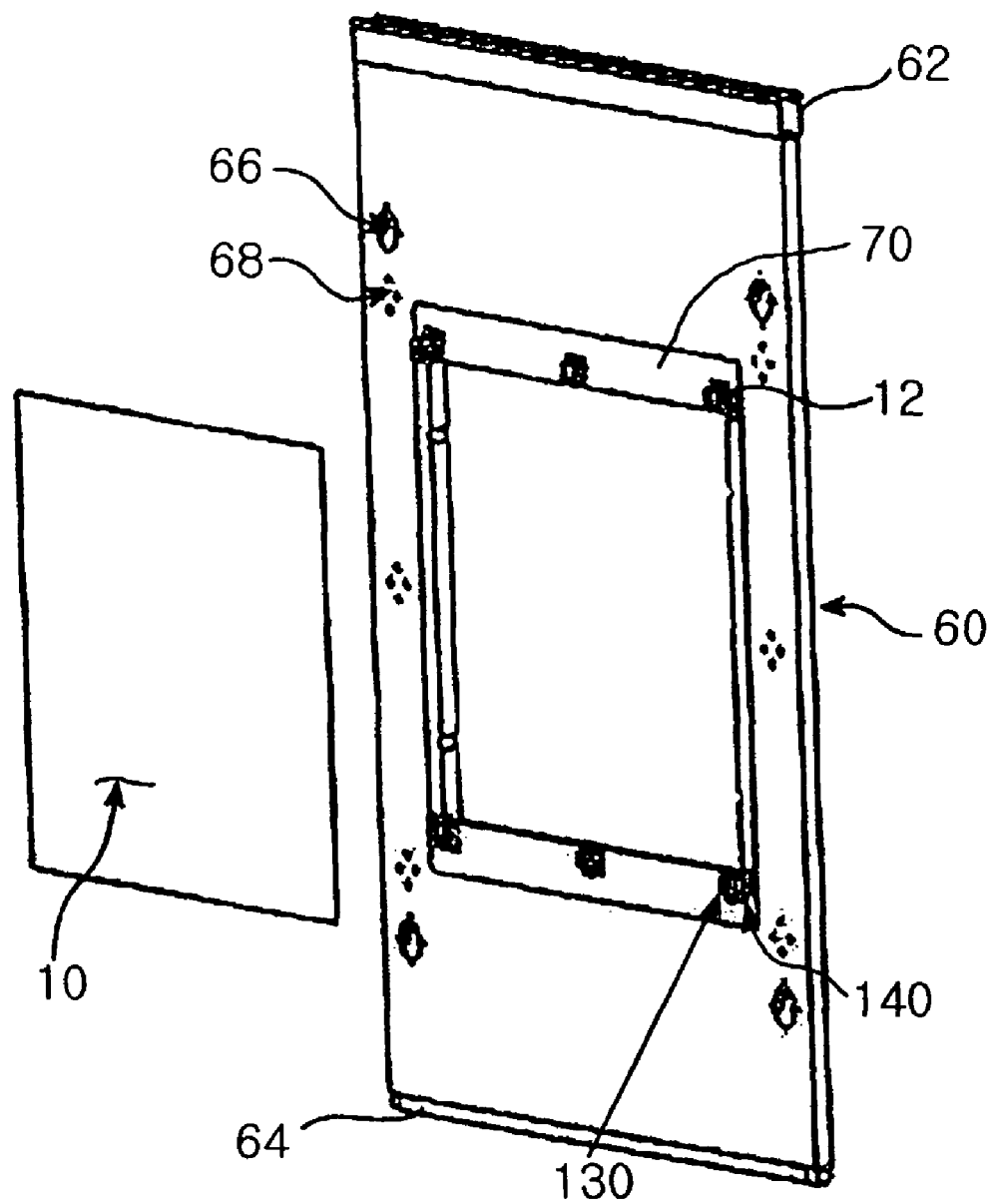
FIG. 11B is a perspective view showing the holding tray when the substrate is detached from the holding tray of the substrate alignment system.
Figure 11C:
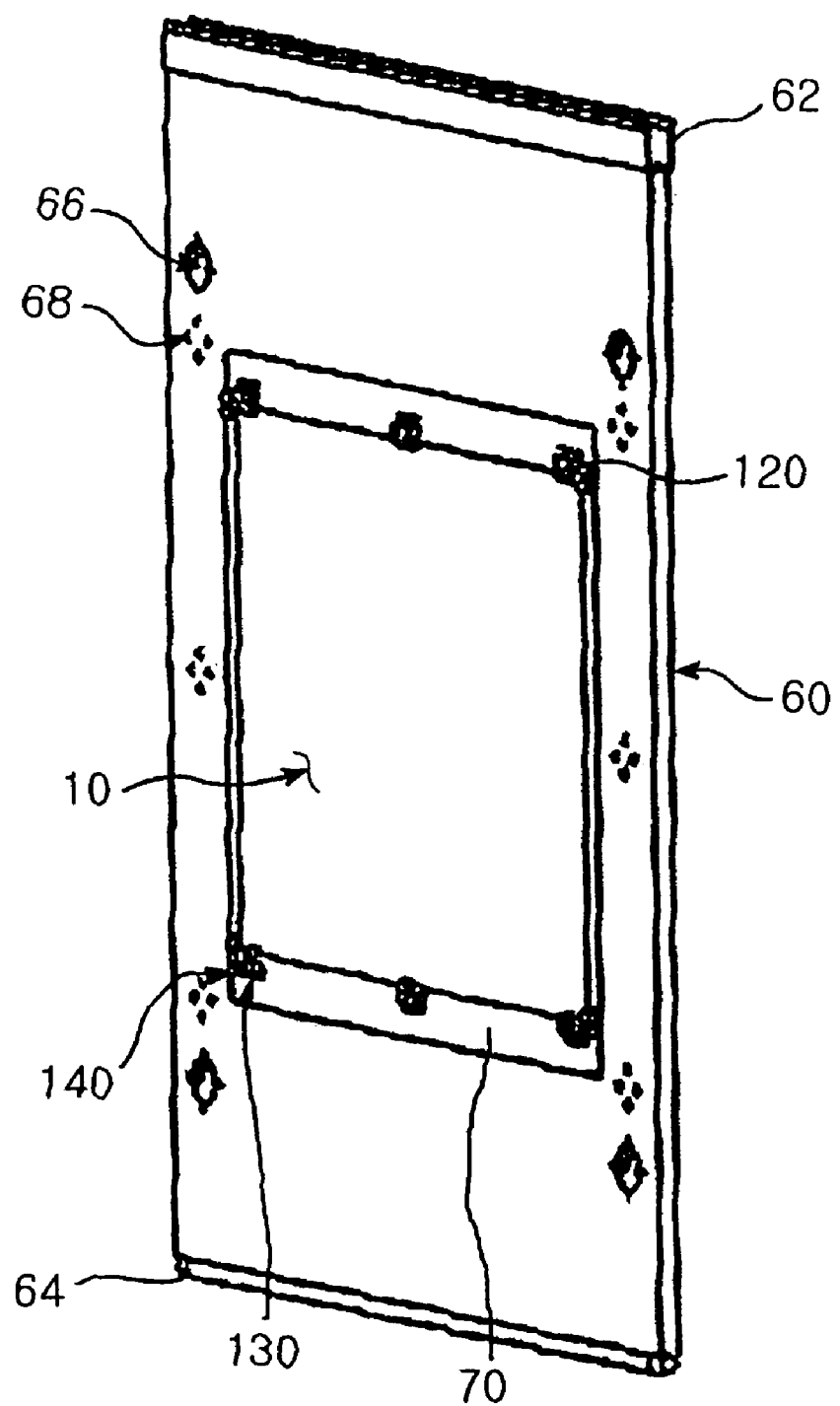
FIG. 11C is a perspective view showing the holding tray when the substrate is attached in the holding tray of the substrate alignment system.

FIG. 11A is a perspective view showing the substrate, the substrate frame, and the tray in the holding tray of the substrate alignment system according to an embodiment of the present invention. FIG. 11B is a perspective view showing the holding tray when the substrate is detached from the holding tray of the substrate alignment system according to an embodiment of the present invention. FIG. 11C is a cross sectional view showing the holding tray when the substrate is attached to the holding tray of the substrate alignment system according to an embodiment of the present invention.

Referring to FIGS. 11A to 11C, the frame 70 is coupled to a front of the tray 60, and the substrate 10 is coupled to the frame 70 from the rear surface of the tray 60. The frame 70 is coupled to an opening formed in the central region of the tray 60, and then held to the tray 60 by the support plate for frame. Then, the substrate 10 is coupled to an opening formed in the frame 70, and then held to the frame 70 by the holding means 110, 120, 130, and 140. The process that the substrate 10 is held to the frame 70 by means of the holding means 110, 120, 130, and 140 is described above in detail. The holding tray for holding the substrate 10 is completely assembled by coupling the frame 70 and the substrate 10 to the tray 60.

Figure 12A:
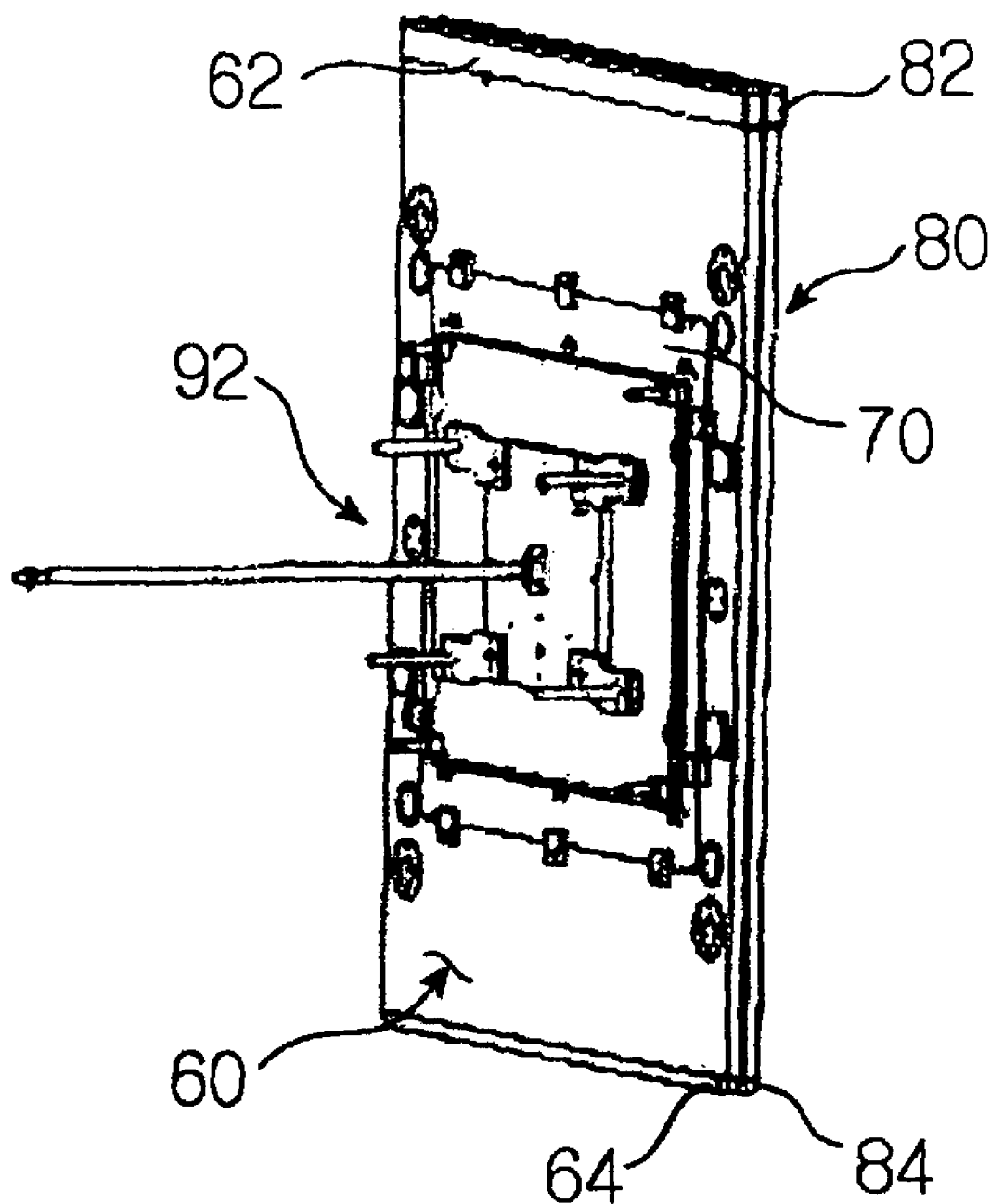
FIG. 12A is a perspective view showing the substrate alignment system when the holding tray, the mask tray, and the chuck of the substrate alignment system are coupled together.
Figure 12B:
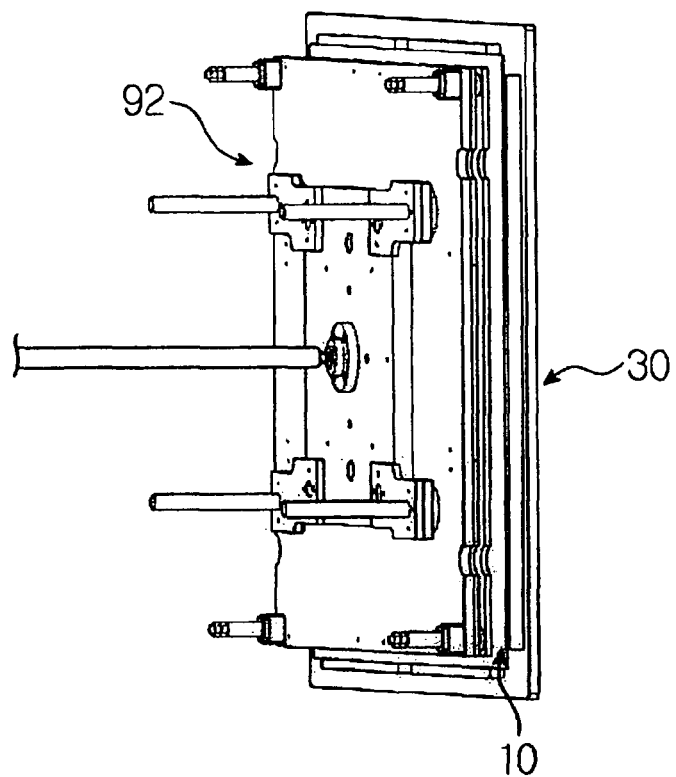
FIG. 12B is a perspective view showing the substrate alignment system when the substrate is coupled with the mask.
Figure 13A:
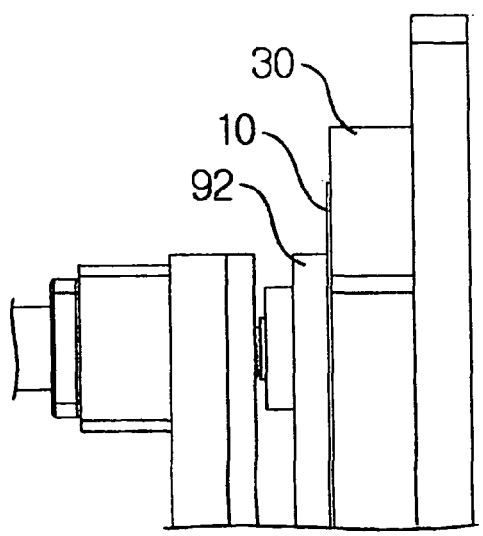
FIG. 13A is a cross sectional view showing upper portion of the substrate alignment system when the holding tray, the mask tray, and the chuck of the substrate alignment system are coupled together.
Figure 13B:
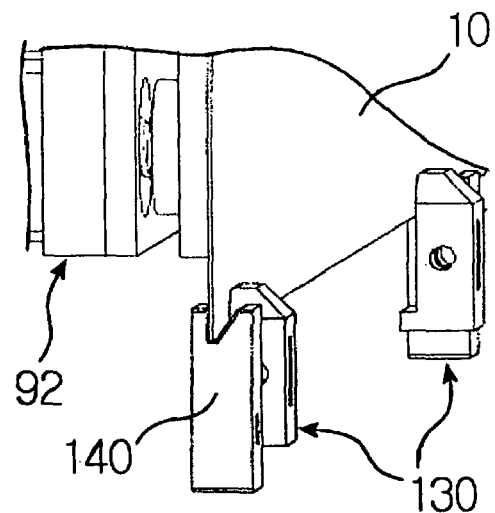
FIG. 13B is a perspective view showing part of the lower portion when the substrate, holding means, and the chuck of the substrate alignment system are coupled together.

FIG. 12A is a perspective view showing the substrate alignment system when the holding tray, the mask tray, and the chuck of the substrate alignment system are coupled together according to an embodiment of the present. FIG. 12B is a perspective view showing the substrate alignment system when the substrate is coupled with the mask of FIG. 12A. FIG. 13A is a cross sectional view showing part of the upper portion when the holding tray, the mask tray and the chuck of the substrate alignment system are coupled together according to an embodiment of the present invention. FIG. 13B is a perspective view showing part of the lower portion when the substrate, holding means, and the chuck of the substrate alignment system are coupled together according to an embodiment of the present invention.

Referring to FIGS. 12A to 13B, the substrate 10 mounted on the tray 60 and the shadow mask mounted on the mask tray 80 are aligned, and then are coupled with the chuck 92 of the alignment plate 90. The chuck 92 of the alignment plate 90 includes a driving means, and therefore may move horizontally and reciprocally so that the substrate 10 comes into close contact with the shadow mask. At this time, the lower portion of the substrate 10 is held by the third and fourth holding means 130 and 140, and the upper portion and side surface of the substrate 10 are also held and supported by the holding means 110 and 120, respectively.

Figure 14A:
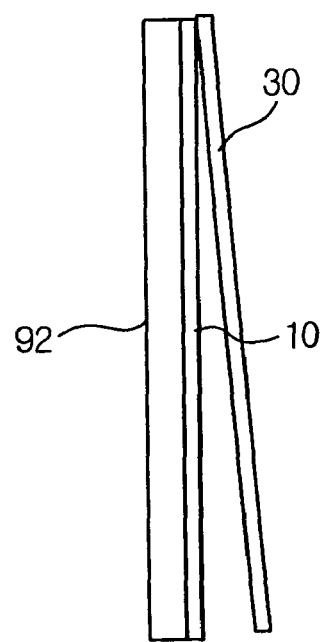
FIG. 14A is a schematic view showing incomplete contact of the substrate with a mask.
Figure 14B:
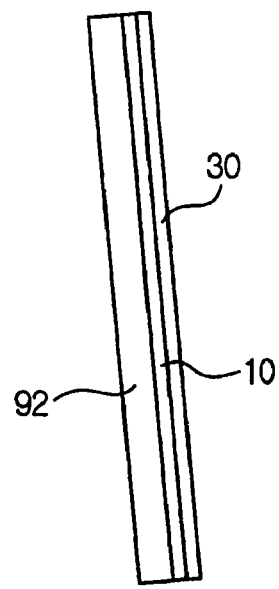
FIG. 14B is a schematic view showing complete contact of the substrate with a mask.

FIG. 14A is a schematic view showing incomplete contact of the mask 30 with the substrate 10 coupled with the chuck 92 of the substrate alignment system according to an embodiment of the present invention. FIG. 14B is a schematic view showing complete contact of the mask 30 with the substrate that is coupled with the chuck of the substrate alignment system according to an embodiment of the present invention.

Referring to FIGS. 14A and 14B, the substrate 10 and the mask 30 generate slip when the chuck 92 is pressed. That is to say, the substrate 10 and the mask 30 slid together, or are not parallel to each other. The slip is avoided if the chuck 92 is more pressed, but the alignment of the substrate 10 and the mask 30 is mismatched in the process, because pressure of the chuck 92 applied to the substrate 10 and pressure applied to the mask 30 are slightly different, and pressure distribution of the entire area of the substrate 10 is slightly not even.

Figure 15A:
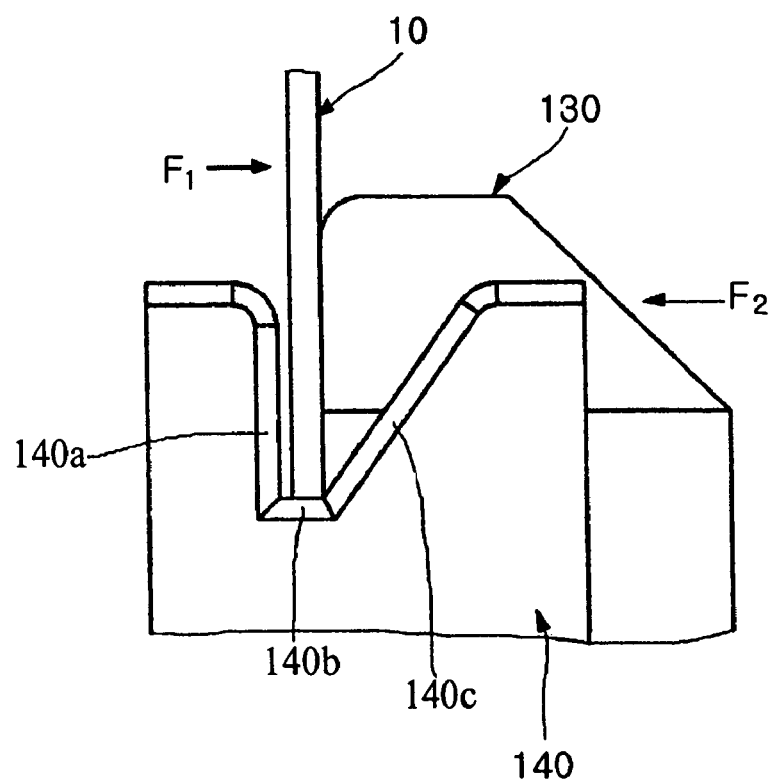
FIG. 15A is a cross sectional view showing operation of the third holding means 130.
Figure 15B:
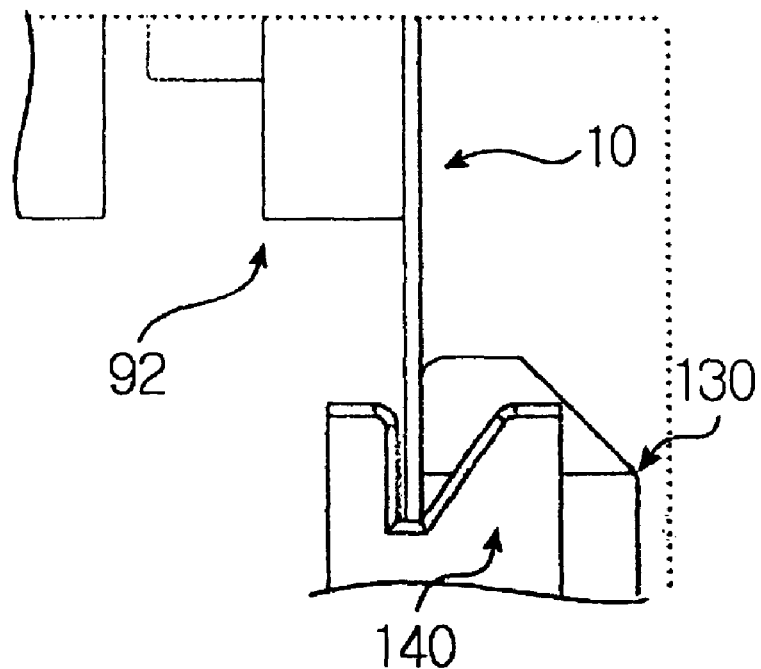
FIG. 15B is a cross sectional view showing incomplete contact of the substrate with a mask tray.
Figure 15C:
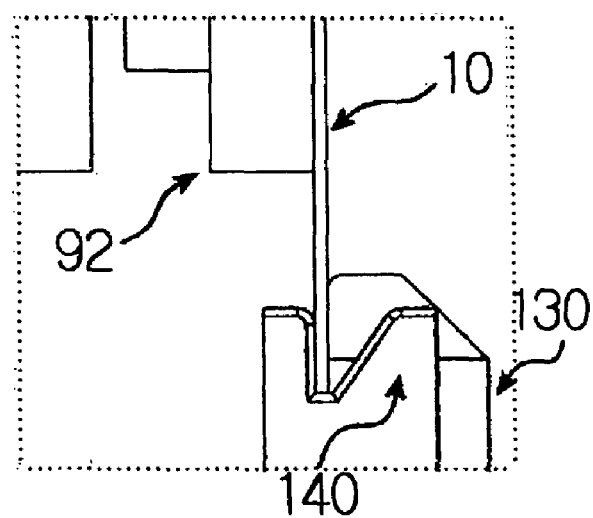
FIG. 15C is a cross sectional view showing complete contact of the substrate with a mask tray.

FIG. 15A is a cross sectional view showing operation of the third holding means 130 of the substrate alignment system according to an embodiment of the present invention. FIG. 15B is a cross sectional view showing incomplete contact of the substrate with the mask tray in the substrate alignment system according to an embodiment of the present invention. FIG. 15C is a cross sectional view showing complete contact of the substrate with the mask tray in the substrate alignment system according to an embodiment of the present invention.

Referring to FIGS. 15A to 15C, the substrate 10 is pushed to the mask tray (not shown) by the force $F_1$ generated by the pressure of the chuck 92, and therefore the substrate 10 closely adheres to the mask tray but incompletely. The substrate 10, being pushed by the force ($F_1$) generated by the pressure, moves along the lower surface of the protruded groove 140b formed in the holding means 140. Accordingly, there is no slide between the substrate 10 and the shadow mask 30 that contacts the substrate 10, and free movement is accomplished while the substrate 10 and the shadow mask 30 is being combined even when the chuck plate 90 (FIG. 10B) is pressed. The substrate 10 should not be detached from the frame 70 since the holding means 140 provides only a slightly larger gap than the thickness of the substrate 10.

Also, the force ($F_1$) generated by the pressure is compensated with a force ($F_2$) generated by the pressures of the holding means 110 and 130, which hold and support the substrate 10 by the pressures of the elastic means engaged with the holding means 110 and 130. That is to say, although the aforementioned substrate 10 and the mask coalesced with the substrate 10 are pushed away by the force ($F_1$) generated by the pressure, the substrate 10 is pressed to closely adhere to the frame 70 that is mounted on the substrate tray 60, and then the substrate 10 closely and completely adheres to the frame 70. As described above, the coalescence with the substrate 10 and the mask is accomplished by means of the holding means 110, 120, 130, and 140 without altering the alignment.

Hereinafter, a preferred embodiment of a method for aligning the substrate using the holding tray according to an embodiment of the present invention will be described in detail with reference to the accompanying drawings.

The method for aligning the substrate using the holding tray for substrate according to the present invention includes steps of providing a substrate for a holding tray, anchoring and supporting the substrates to protruded grooves of a second and a fourth holding means of the holding tray, and inserting projections for insertion of a first and a third holding means of the holding tray into the protruded groove formed in the frame to press and make closely contact of a front surface of the substrate with the frame.

Referring to FIGS. 11A to 11C, the frame 70 is coupled to a front of the tray 60, and the substrate 10 is coupled to the frame 70 from the rear surface of the tray 60. The frame 70 is coupled to an opening formed in the central region of the tray 60, and then held to the tray 60 by the support plate for frame. Then, the substrate 10 is coupled to an opening formed in the frame 70, and then held to the frame 70 by the holding means 110, 120, 130, and 140. The process where the substrate 10 is held to the frame 70 by means of the holding means 110, 120, 130, and 140 was described above in detail. The holding process for holding the substrate 10 is completed by coupling the frame 70 and the substrate 10 to the tray 60, and a step of providing the holding tray 60 with the substrate 10 is accomplished.

Referring to FIGS. 3A to 3C, the first and the third holding means 110 and 130, which are positioned on the upper portion and the lower portion of the substrate 10, respectively, are formed to elastically hold and support the substrate 10. Here, elasticity, with which the holding means 110 and 130 hold and support the substrate 10, is accomplished by an elastic means 136 that is further included in the holding means 110 and 130, and the elastic means 136 is preferably a spring member. The elastic means 136 is formed to anchor a coupling member 135 to the coupling hole formed in the holding means 130 so that it can be sustained into the coupling member 135, as shown in FIG. 3C.

The projections for insertion 111 and 131 are formed in the holding means 110 and 130, respectively, to be inserted into the protruded grooves 71a or 71b, and 73a or 73b, respectively, formed on the frame 70. The protruded grooves 71a and 71b formed in the upper portion of the frame 70 are formed to receive the projection for insertion 111 of the holding means 110. The holding means 110 is inserted into the first protruded groove 71a when it presses the substrate 10, and the holding means 110 is inserted into the second protruded groove 71b when it depresses the substrate 10. The protruded grooves 73a and 73b formed in the lower portion of the frame 70 are formed to receive the projection for insertion 131 of the third holding means 130. The third holding means 130 is inserted into the third protruded groove 73a when it presses the substrate 10, and the third holding means 130 is inserted into the fourth protruded groove 73b when it depresses the substrate 10.

When the substrate 10 is being mounted in the frame 70, the elastic means of the holding means 110 and 130 are first stretched under tension, and after the substrate 10 is completely anchored in the frame 70, the elastic means are released having the holding means 110 and 130 press the substrate 10. By these steps, the substrate 10 is anchored to the frame 70.

Also, the second holding means 120 positioned in the side surface is formed to be held in the grooves (not shown) formed in the frame 70, and a step height is formed to receive thickness of the substrate 10 so that the substrate 10 can be received in a direction into which the substrate 10 is charged. That is to say, the side surface of the holding means 120 forms the protruded grooves along with the frame 70 while it adheres to the frame 70, and therefore thickness of the substrate 10 is received into the protruded grooves. When the substrate 10 is mounted on the frame 70, the substrate 10 is received into the step height of the holding means 120, namely the protruded groove formed along with the frame 70. The holding means 120 assists the substrate 10 when the substrate 10 is held and supported by the frame 70 by the aforementioned holding means 110 and 130.

Referring to FIGS. 4A to 4D, FIGS. 5A to 5C, FIGS. 10A to 10B, and FIGS. 15A to 15C, the substrate 10 is pushed to the mask tray 80 by the force ($F_1$) generated by the pressure of the chuck 92, and therefore the substrate 10 closely adheres to the mask tray but incompletely. The substrate 10, being pushed by the force ($F_1$) generated by the pressure, moves along the lower surface of the protruded groove 140b formed in the holding means 140. Accordingly, there is no slide between the substrate 10 and the shadow mask 30 coalesced with the substrate 10, and free movement is accomplished in the coalesced state even when the chuck plate 90 is pressed. The substrate 10 should not be detached from the frame 70, because the holding means 140 provides only a slightly larger gap than the thickness of the substrate 10.

Also, the force ($F_1$) generated by the pressure is compensated with a force ($F_2$) generated by the pressures of the holding means 110 and 130 that hold and support the substrate 10 by the pressures of the elastic means engaged with the holding means 110 and 130. That is to say, although the aforementioned substrate 10 and the mask coalesced with the substrate 10 are pushed away by the force ($F_1$) generated by the pressure, the substrate 10 is pressed to closely adhere to the frame 70 that is mounted on the substrate tray 60, and then the substrate 10 closely and completely adheres to the frame 70. As described above, the coalescence with the substrate 10 and the mask is accomplished by means of the holding means 110, 120, 130, and 140 without altering the alignment.

As described above, the method for aligning the substrate using the holding tray according to the present invention conducts a step of anchoring and supporting the substrate 10 to the protruded grooves of the second holding means 120 and the fourth holding means 140 of the holding tray 60, and then a step of inserting the projections for insertion 111 of the first holding means 110 and the projections for insertion 131 of the third holding means 130 of the holding tray 60 into the protruded grooves for pressure 71a and 73a, respectively, formed in the frame 70 to press and make close contact of the substrate 10 with the frame 70.

Hereinafter, a more preferred embodiment of a method for aligning the substrate using the holding tray according to an embodiment of the present invention will be described in detail with reference to the accompanying drawings.

Figure 16:
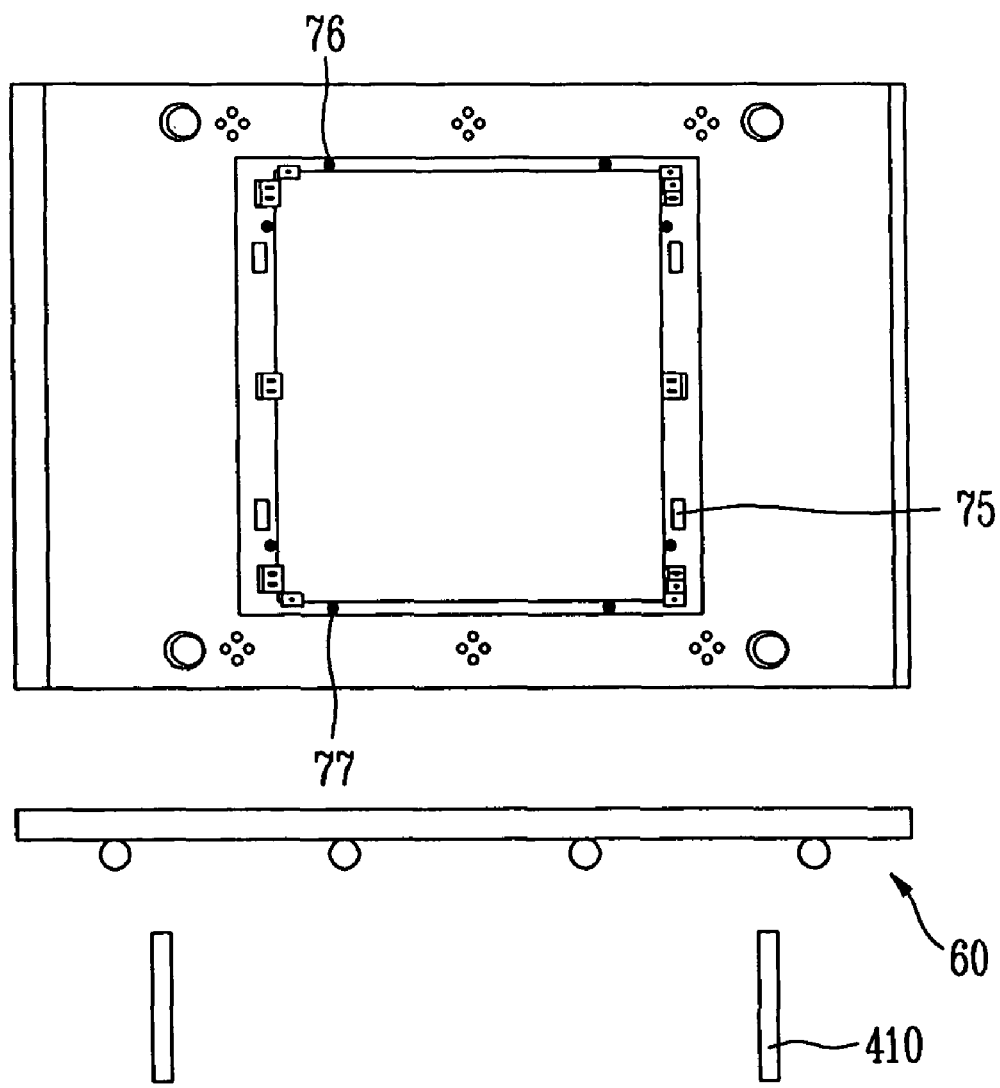
FIG. 16 is a schematic view showing a step of anchoring the tray in the method for aligning the substrate using the holding tray.
Figure 17:
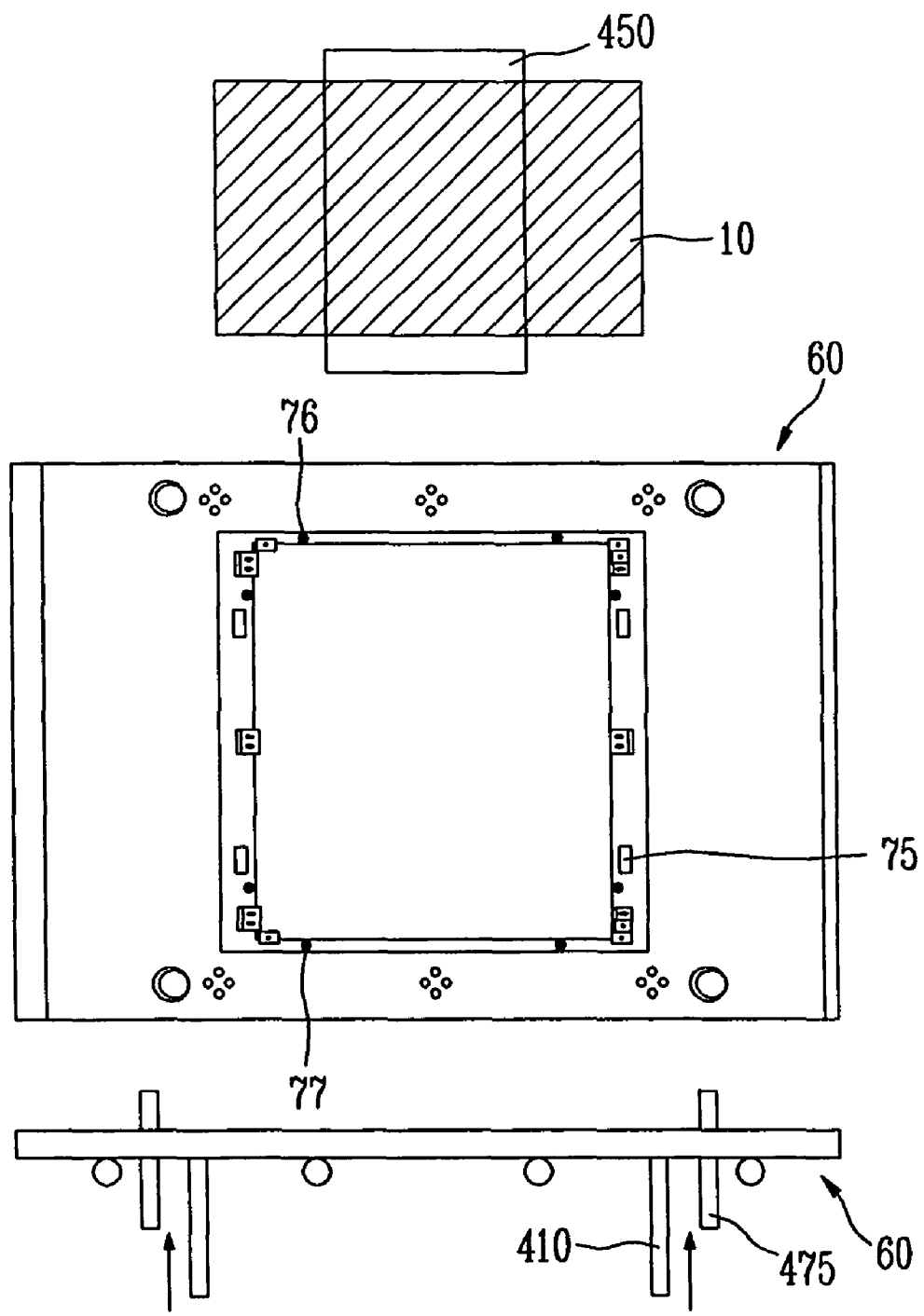
FIG. 17 is a schematic view showing a step of placing the substrate in the method for aligning the substrate using the holding tray.
Figure 18:
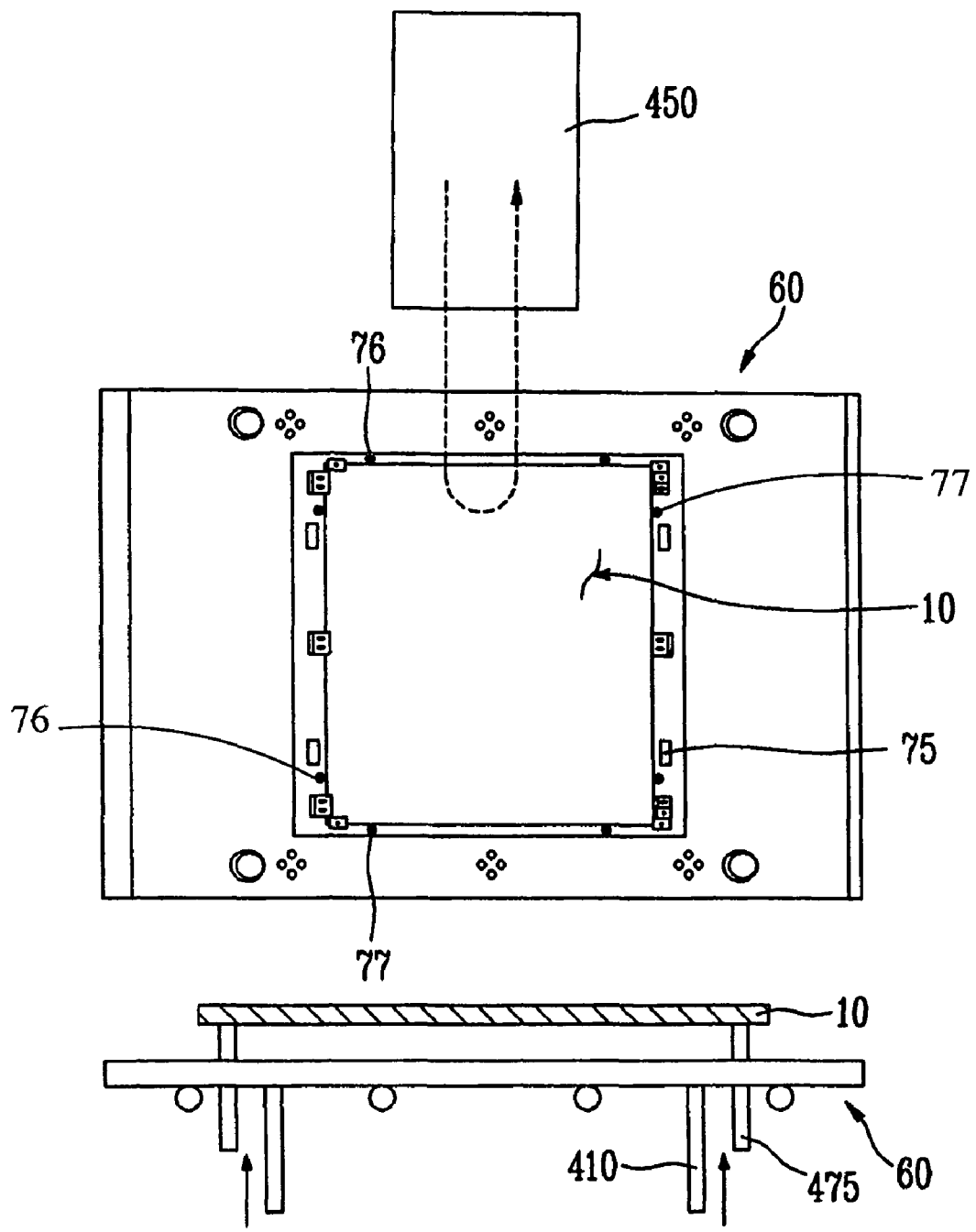
FIG. 18 is a schematic view showing a step of handling the substrate in the method for aligning the substrate using the holding tray.
Figure 19:
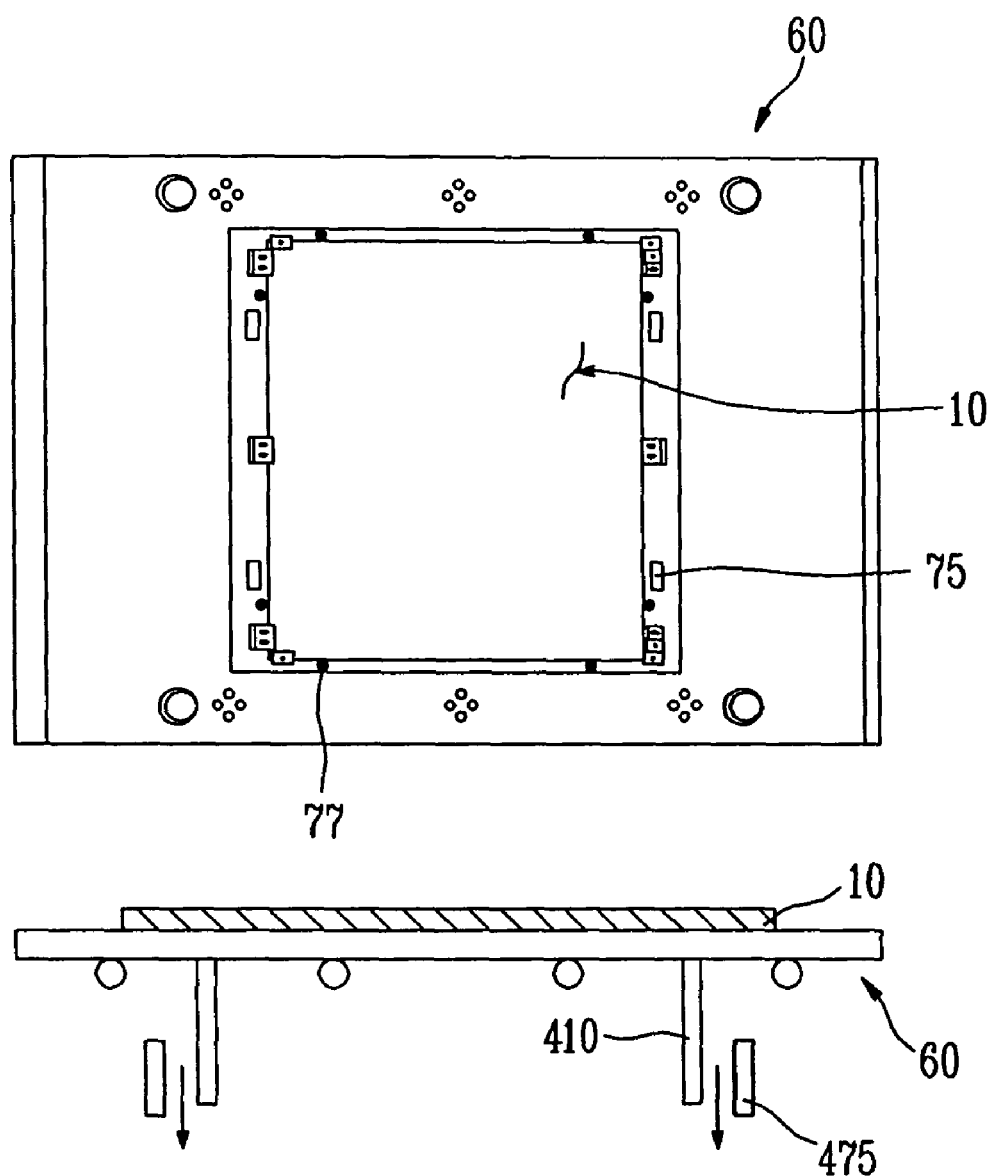
FIG. 19 is a schematic view showing a step of anchoring the substrate in the method for aligning the substrate using the holding tray.
Figure 20:
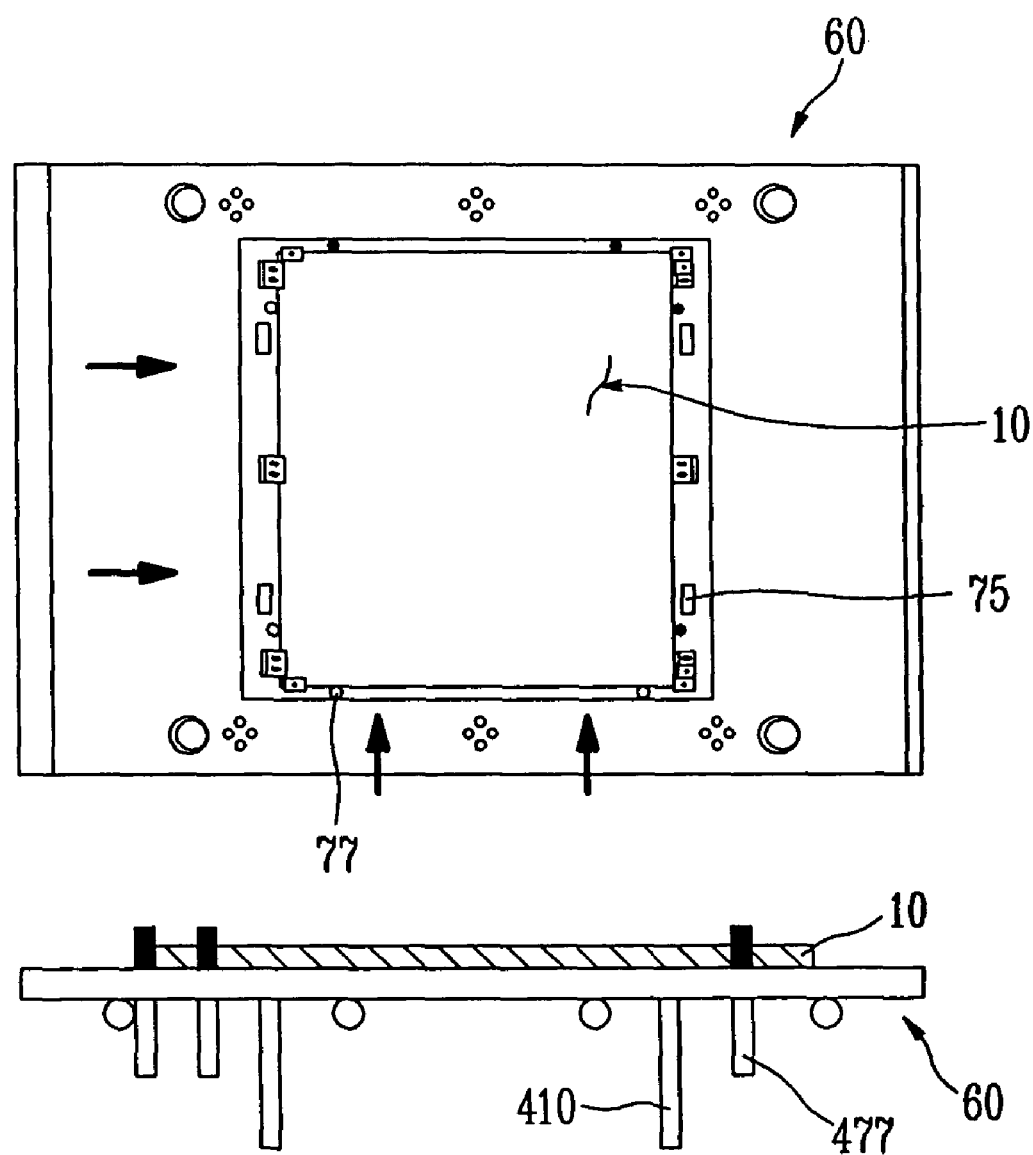
FIG. 20 is a schematic view showing a step of aligning the substrate in the method for aligning the substrate using the holding tray.
Figure 21:
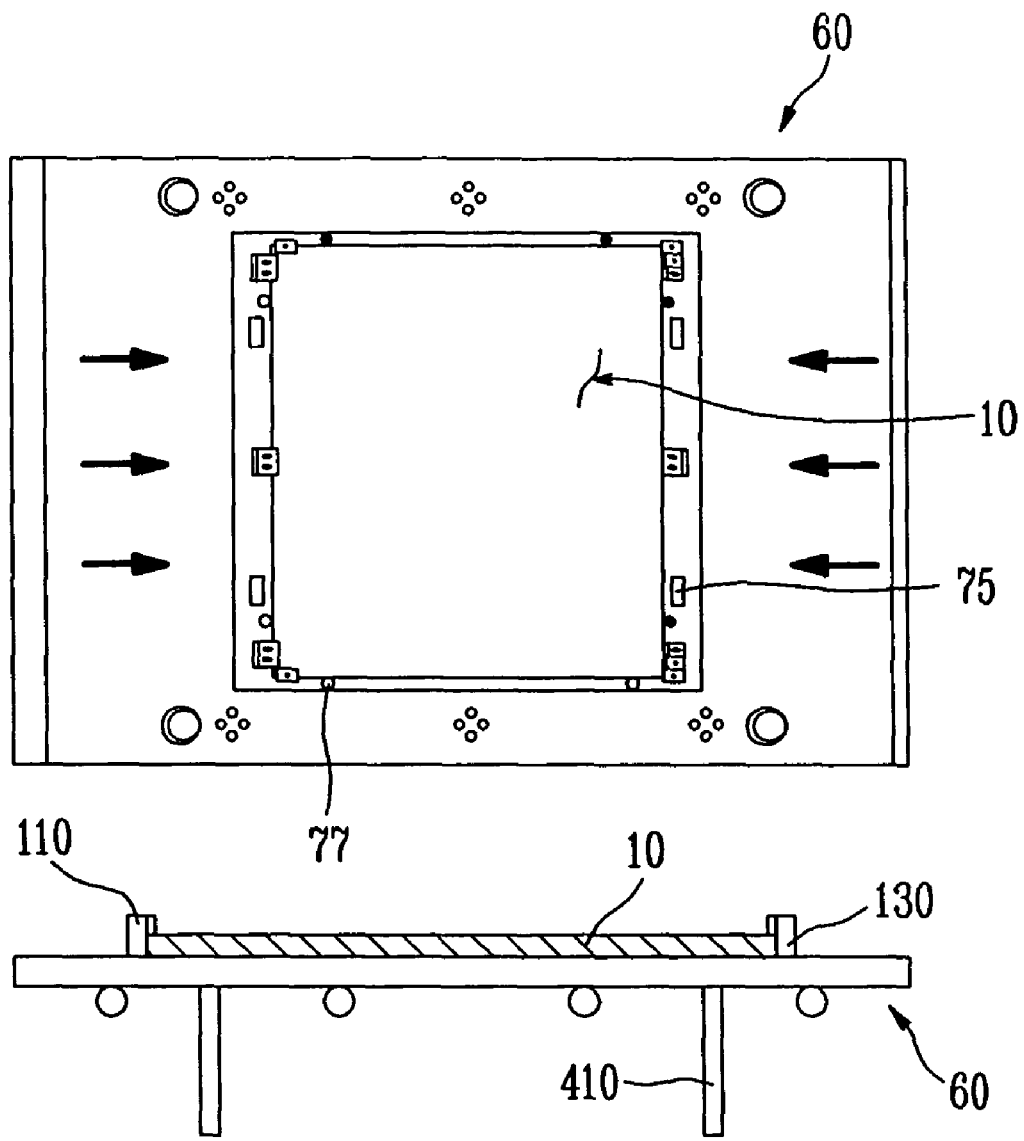
FIG. 21 is a schematic view showing a step of holding the substrate in the method for aligning the substrate using the holding tray.
Figure 22A:
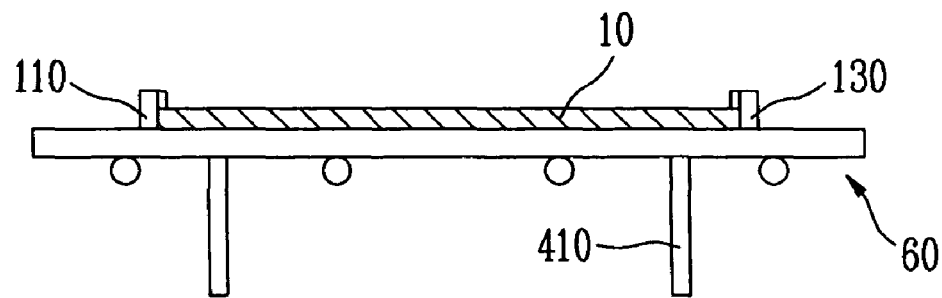
FIGS. 22A and 22B are schematic views showing steps of standing the tray in the method for aligning the substrate using the holding tray.
Figure 22B:
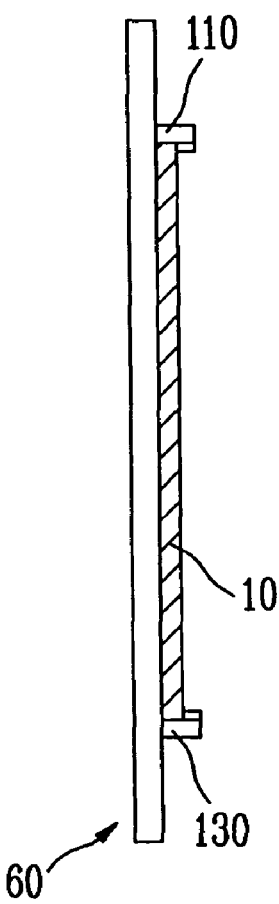

FIG. 16 is a schematic view showing a step of anchoring the tray in the method for aligning the substrate using the holding tray according to an embodiment of the present invention. FIG. 17 is a schematic view showing a step of entering the substrate in the method for aligning the substrate using the holding tray according to an embodiment of the present invention. FIG. 18 is a schematic view showing a step of handling the substrate in the method for aligning the substrate using the holding tray according to an embodiment of the present invention. FIG. 19 is a schematic view showing a step of anchoring the substrate in the method for aligning the substrate using the holding tray according to an embodiment of the present invention. FIG. 20 is a schematic view showing a step of aligning the substrate in the method for aligning the substrate using the holding tray according to an embodiment of the present invention. FIG. 21 is a schematic view showing a step of holding the substrate in the method for aligning the substrate using the holding tray for substrate according to an embodiment of the present invention. FIGS. 22A and 22B are schematic views showing steps of lifting and standing the tray in the method for aligning the substrate using the holding tray for substrate according to an embodiment of the present invention.

The method for aligning a substrate using the holding tray according to the present invention includes steps of anchoring a tray where the tray provided in the frame is anchored onto a tray support means, providing a substrate where the substrate is placed onto the tray, handling the substrate where the substrate placed onto the tray is supported by a substrate handler, anchoring the substrate where the substrate supported by the substrate handler is anchored onto the tray, aligning the substrate where the substrate is aligned by a substrate alignment means, holding the aligned substrate where the aligned substrate is held on the tray by holding means, standing the tray where the tray onto which the substrate is anchored is stood by the tray support means, and inputting the tray where the tray is delivered into a chamber.

First, the tray 60 provided with the frame 70 is anchored onto a tray supporting means 410. The tray supporting means 410 is formed to support the tray 60 in parallel, and the tray 60 is horizontally anchored onto the tray supporting means 410. Then, a substrate 10 spaced apart by a robot arm 450 enters into the upper portion of the tray 60 placed on the tray supporting means 410. When the substrate 10 enters by the robot arm 450, the substrate handler 475 supports the substrate 10 by means of the through hole 75 formed on the frame 70 of the tray 60. When the substrate 10 is supported by the substrate handler 475, the robot arm 450 is completely retracted from the position 11 on which the tray 60 is placed. Therefore, the robot arm 450 is preferably formed and operated in a manner that it does not interfere with the substrate handler 475 in its operation.

When the substrate 10 is supported by the substrate handler 475, being spaced apart from the robot arm 450, the substrate handler 475 is retracted through the through hole 475 formed on the frame 70. Accordingly, the substrate 10 is spaced apart by the substrate handler 475, and is anchored onto the frame 70 of the tray 60.

Then, the substrate 10 anchored onto the frame 70 of the tray 60 undergoes the alignment step. The alignment step is carried out by adjusting the substrate 10 in a manner that push pins 477 pass through the tray 60 from the rear surface of the tray 60 via the adjustment holes 77 formed on the frame 70, and then two edges of the substrate 10 can be in contact with the reference pins 76. The reference pins 76 are positioned in the nearest two edges of the rectangular frame 70. Two adjustment holes 77 are formed in the other two edges in which the reference pins 76 are not formed, and the push pins 477 may adjust the position of the substrate 10 to the reference pins 76 by means of the adjustment holes 77.

Instead of the reference pin 76 formed on the frame 70, the reference hole 78 (FIG. 6B) may be also formed to conduct the alignment step. At this time, a reference arm (not shown) is formed through the rear surface of the tray 60 to provide a reference position. Also, both of the reference pin 76 and the reference hole 78 may be formed at the same embodiment.

According to the aforementioned alignment step, the substrate 10 is aligned on the frame 70 of the tray 60, and then the substrate 10 is held on the aligned position by means of the first and the third holding means 110 and 130. When the holding means 110 and 130 are input into the substrate 10 by means of the substrate clamp pusher (not shown), the holding means 110 and 130 moves from the second position, where the holding means does not interfere with the substrate 10, to the first position, where the holding means are set to elastically hold the substrate 10 (see FIG. 7). The holding means 110 and 130 moved to the first position are aligned to hold the substrate 10.

After the substrate 10 is aligned and held, the tray 60, where the substrate 10 is horizontally mounted by the tray supporting means 410, is lifted from the tray supporting means 410, and is turned to a vertical standing position, and then proceeds into the process chamber (not shown).

As described above, high-precision alignment may be accomplished and stable deposition process may be also conducted, because the perpendicularly arranged substrate may be held and supported according to the holding tray constructed according to the present invention, the substrate alignment system using the same, and the method thereof.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. A holding tray comprising:
   a frame formed for holding a substrate;
   a tray for holding the frame, the tray having a through hole, the frame being disposed inside the through hole of the tray; and
   at least one holding device formed on the frame for holding the substrate, an edge portion of the substrate being disposed between the frame and the at least one holding device, the at least one holding device pressing the substrate onto the frame, the at least one holding device comprising:
      an elastic member, a first end of the elastic member of the at least one holding device being anchored in the at least one holding device, a second end of the elastic member of the at least one holding device being directly fixed to the frame; and
      a press member for pressing an upper surface of the substrate to the frame, the press member being in a first position for pressing the upper surface of the substrate to the frame, the press member being rotated about an axis perpendicular to the upper surface of the substrate to be in a second position for releasing the substrate from the frame.

2. The holding tray of claim 1, comprised of the at least one holding device further comprising a projection, and the frame further comprising a first protruded groove and a second protruded groove, the projection being inserted into the first protruded groove for holding the substrate to the frame, and the projection being inserted into the second protruded groove for releasing the substrate from the frame.

3. The holding tray of claim 1, wherein the at least one holding device further comprises:
   a coupling hole; and
   a coupling member anchored in the coupling hole of the at least one holding device, the first end of the elastic member of the at least one holding device being anchored in the coupling member of the at least one holding device.

4. The holding tray of the claim 1, further comprising at least one alignment tool formed on the frame for aligning the substrate to the frame.

5. The holding tray of claim 4, the alignment tool comprising:
   a reference element for providing a reference point in at least one edge on the frame; and
   an adjustment element for adjusting position of the substrate so that the substrate can be in contact with the reference element, the adjustment element formed in at least one edge on the frame.

6. The holding tray of claim 5, the reference element being a reference pin.

7. The holding tray of claim 5, the reference element being a reference hole where a reference rod passes through the reference hole.

8. The holding tray of claim 5, the adjustment element being an adjustment hole where an adjustment rod passes through the adjustment hole.

9. The holding tray of claim 4, the alignment tool further comprising a through hole formed in at least two edges of the frame so that a substrate handler passes through the through hole.

10. The holding tray of claim 4, the at least one holding device further comprising clamps formed on the frame for holding the substrate.

11. The holding tray of claim 1, the press member further comprising:
    a projection, the press member being coupled with the frame by the elastic member.

12. The holding tray of claim 11, the frame further comprising a first protruded groove and a second protruded groove, the projection being inserted into the first protruded groove for holding the substrate to the frame, and the projection being inserted into the second protruded groove for releasing the substrate from the frame.

13. The holding tray of claim 12, the press member further comprising:
    a coupling hole; and
    a coupling member anchored in the coupling hole, a first end of the elastic member being anchored in the coupling member and a second end of the elastic member being anchored in the frame.

14. The holding tray of claim 11, the operation of the press member between the first position and the second position being continuously conducted.

15. The holding tray of claim 14, the press member being coupled with a clamp pusher for operating the press member between the first position and the second position.

16. The holding tray of claim 15, the continuous operation of the press member being conducted by moving the press member up or down while turning the clamp pusher.

17. The holding tray of claim 14, the press member being coupled with a guide member for the operation between the first position and the second position.

18. The holding tray of claim 17, the guide member comprising:
    a guide protrusion formed in the projection; and
    a guide groove formed in the frame for matching the guide protrusion.

19. The holding tray of claim 17, the guide member comprising:
    a guide groove formed in the projection; and a guide protrusion formed in the frame to match the guide groove.

20. The holding tray of claim 1, the tray further comprising a holding plate for mounting the frame in the tray.

21. The holding tray of claim 1, the tray further comprising a transportation tool at an edge of the tray for moving the holding tray.

22. The holding tray of claim 1, the tray further comprising a tray guide tool at an edge of the tray for guiding the holding tray while being transported.

23. The holding tray of claim 1, further comprising at least a second holding device formed on the frame, the at least one holding device holding a top edge portion of the substrate, the second holding device supporting a side edge portion of the substrate.

24. The holding tray of claim 23, further comprising at least a third holding device formed on the frame for holding a bottom edge portion of the substrate, the third holding device comprising an elastic member, a first end of the elastic member of the third holding device being anchored in the third holding device, a second end of the elastic member of the third holding device being fixed to the frame.

25. The holding tray of claim 24, wherein the third holding device further comprises:
  a coupling hole; and
  a coupling member anchored in the coupling hole of the third holding device, the first end of the elastic member of the third holding device being anchored in the coupling member of the third holding device.

26. The holding tray of claim 24, further comprising at least a fourth holding device formed on the frame for supporting the bottom edge portion of the substrate.

27. The holding tray of claim 26, wherein the fourth holding device having a protruded groove, the bottom edge portion of the substrate being charged into the protruded groove of the fourth holding device.

28. The holding tray of claim 1, wherein the frame has a protruded groove on a surface of the frame, the frame having a guide groove on a side wall of the protruded groove, the at least one holding device further comprising:
  a projection disposed inside the protruded groove of the frame; and
  a guide protrusion formed on the projection, the guide protrusion disposed inside the guide groove.

29. A substrate alignment system, comprising:
  a holding tray comprising:
    a frame formed for holding a substrate;
    a tray for holding the frame, the tray having a through hole, the frame being disposed inside the through hole of the tray; and
    at least one holding device formed on the frame for holding the substrate, an edge portion of the substrate being disposed between the frame and the at least one holding device, the at least one holding device pressing the substrate onto the frame, the at least one holding device comprising:
      an elastic member, a first end of the elastic member of the at least one holding device being anchored in the at least one holding device, a second end of the elastic member of the at least one holding device being directly fixed to the frame; and
      a press member for pressing an upper surface of the substrate to the frame, the press member being in a first position for pressing the upper surface of the substrate to the frame, the press member being rotated about an axis perpendicular to the upper surface of the substrate to be in a second position for releasing the substrate from the frame;
  a mask facing one surface of the substrate; and
  an alignment plate facing another surface of the substrate, the alignment plate comprising a chuck formed to press the substrate, the chuck moving the substrate towards the mask so that the holding tray can be supported, held and aligned.

30. A method for aligning a substrate, comprising:
coupling the frame of the holding tray of claim 1 to the tray of the holding tray of claim 1;
providing the substrate of claim 1 to the frame;
anchoring and supporting the substrate of claim 1 to grooves of a side supporter and a bottom supporter of the frame; and
inserting a projection of the press member of the at least one holding device of the holding tray of claim 1 into a protruded groove of the frame for pressing and holding the substrate.

* * * * *